US011101200B2

(12) United States Patent
Kitnarong et al.

(10) Patent No.: US 11,101,200 B2
(45) Date of Patent: Aug. 24, 2021

(54) SURFACE-MOUNT INTEGRATED CIRCUIT PACKAGE WITH COATED SURFACES FOR IMPROVED SOLDER CONNECTION

(71) Applicant: Microchip Technology Incorporated, Chandler, AZ (US)

(72) Inventors: Rangsun Kitnarong, Nonthaburi (TH); Vichanart Nimibutr, Nonthaburi (TH); Pattarapon Poolsup, Bangkok (TH); Chanyuth Junjuewong, Chachoengsao (TH)

(73) Assignee: Microchip Technology Incorporated, Chandler, AZ (US)

( * ) Notice: Subject to any disclaimer, the term of this patent is extended or adjusted under 35 U.S.C. 154(b) by 13 days.

(21) Appl. No.: 16/720,269

(22) Filed: Dec. 19, 2019

(65) Prior Publication Data

US 2020/0211936 A1    Jul. 2, 2020

Related U.S. Application Data

(60) Provisional application No. 62/787,112, filed on Dec. 31, 2018.

(51) Int. Cl.
*H01L 23/495* (2006.01)
*H01L 21/48* (2006.01)
(Continued)

(52) U.S. Cl.
CPC .... *H01L 23/49541* (2013.01); *H01L 21/4825* (2013.01); *H01L 21/4842* (2013.01);
(Continued)

(58) Field of Classification Search
CPC .......... H01L 23/3107; H01L 23/49582; H01L 23/49568; H01L 23/49541; H01L 21/4825
See application file for complete search history.

(56) References Cited

U.S. PATENT DOCUMENTS 6,624,007 B2    9/2003  Kobayakawa et al. ....... 438/123
8,685,795 B2    4/2014  Wang et al. .................. 438/114
(Continued)

FOREIGN PATENT DOCUMENTS

WO    2009/125250 A1    10/2009    ........... H01L 23/495

OTHER PUBLICATIONS

PCT Partial International Search Report and Invitation to Pay Additional Fees, Application No. PCT/US2019/067807, 14 pages, dated Apr. 23, 2020.
(Continued)

*Primary Examiner* — Zandra V Smith
*Assistant Examiner* — John M Parker
(74) *Attorney, Agent, or Firm* — Slayden Grubert Beard PLLC

(57) ABSTRACT

Methods are disclosed for forming flat leads packages (e.g., QFP or SOT packages) having leads coated with a solder-enhancing material for improved solder mounting to a PCB or other structure. The method may include forming a flat leads package structure including an array of encapsulated IC structures formed on a common leadframe. An isolation cutting process may be performed to electrically isolate the IC structures from each other and define a plurality of leadframe leads extending from each IC structure. After the isolation cutting process, an immersion coating process is performed to coat exposed surfaces of the leadframe leads, including the full surface area of a distal end of each leadframe lead. The coating (e.g., tin coating) covering the distal ends of the leadframe leads may enhance the flow of solder material, e.g., when soldering to a PCB, to provide an improved solder connection.

16 Claims, 15 Drawing Sheets

(51) Int. Cl.
  *H01L 21/78*  (2006.01)
  *H01L 23/00*  (2006.01)
  *H01L 23/31*  (2006.01)
  *H05K 1/18*  (2006.01)
  *H01L 21/56*  (2006.01)

(52) U.S. Cl.
  CPC .......... *H01L 21/78* (2013.01); *H01L 23/3121* (2013.01); *H01L 23/49582* (2013.01); *H01L 24/97* (2013.01); *H05K 1/181* (2013.01); *H01L 21/561* (2013.01); *H01L 21/565* (2013.01); *H01L 24/48* (2013.01); *H01L 2224/48091* (2013.01); *H01L 2224/48177* (2013.01); *H05K 2201/10636* (2013.01)

(56) References Cited

U.S. PATENT DOCUMENTS

| | | | |
|---|---|---|---|
| 2015/0076690 A1* | 3/2015 | Yoshino | H01L 23/49582 257/737 |
| 2017/0162530 A1* | 6/2017 | Lin | H01L 21/78 |
| 2017/0271249 A1 | 9/2017 | Kasuya | |
| 2018/0145013 A1* | 5/2018 | Truhitte | H01L 21/561 |
| 2018/0366396 A1 | 12/2018 | Komatsu et al. | |

OTHER PUBLICATIONS

International Search Report and Written Opinion, Application No. PCT/US2019/067807, 19 pages, dated Jul. 8, 2020.

\* cited by examiner

1000

| IMMERSION TIME | TIN THICKNESS (U-INCH) |
|---|---|
| FIFTEEN MINS | POINT 1: 50.32<br>POINT 2: 50.04<br>POINT 3: 50.78<br>POINT 4: 51.19<br>POINT 5: 49.37<br>POINT 6: 53.67<br>MIN : 49.37   MAX : 53.67   AVG : 50.90 |
| TWENTY MINS | POINT 1: 61.23<br>POINT 2: 61.14<br>POINT 3: 73.01<br>POINT 4: 53.91<br>POINT 5: 52.56<br>POINT 6: 62.69<br>MIN : 52.56   MAX : 73.01   AVG : 60.69 |
| THIRTY MINS | POINT 1: 83.20<br>POINT 2: 91.55<br>POINT 3: 75.37<br>POINT 4: 109.49<br>POINT 5: 80.16<br>POINT 6: 75.12<br>MIN : 75.12   MAX : 109.49   AVG : 85.81 |
| FORTY EIGHT MINS | POINT 1: 84.83<br>POINT 2: 123.08<br>POINT 3: 77.49<br>POINT 4: 87.96<br>POINT 5: 132.93<br>POINT 6: 91.73<br>MIN : 77.49   MAX : 132.93   AVG : 99.67 |

SURFACE-MOUNT INTEGRATED CIRCUIT PACKAGE WITH COATED SURFACES FOR IMPROVED SOLDER CONNECTION

RELATED PATENT APPLICATION

This application claims priority to commonly owned U.S. Provisional Patent Application No. 62/787,112 filed Dec. 31, 2018, the entire contents of which are hereby incorporated by reference for all purposes.

TECHNICAL FIELD

The present disclosure relates to surface-mount integrated circuit (IC) packages, for example flat no-leads packages and flat leads packages with improved wettable leadframe surfaces, e.g., by performing a tin immersion process to coating such surfaces, for improved solder connection of such IC packages to a PCB or other structure.

BACKGROUND

Two common types of surface-mount packages for connecting an integrated circuit device (e.g., die or chip) to a printed circuit board (PCB) are (1) flat packages having no leads extending out from the side(s) of the package, referred to herein as "flat no-leads packages" and (2) packages having a number of leads extending out from the side(s) of the package, referred to herein as "flat leads packages."

Flat no-leads packages, for example quad-flat no-leads (QFN) and dual-flat no-leads (DFN) allow an IC device (e.g., die or chip) to be secured to a PCB by a surface mount solder connection without package leads or through holes in the PCB. FIG. 1 shows a cross-sectional view of an example QFN package 100. As shown, the QFN package 100 may include a semiconductor die (chip) 102 mounted on a leadframe 104 (e.g., copper leadframe) and encapsulated in an insulating mold compound 106. The leadframe 104 may include a die attach pad 110, on which the die 102 is mounted, and a number of terminals 112 at the perimeter of the package. The die may be attached to each leadframe terminal 112 by a wire bond 114. Each leadframe terminal 112 can be solder mounted to an underlying PCB pad, to provide a physical and electrical connections between the QFN package 100 and the PCB.

A common challenge with flat no-leads packages concerns the ability to form effective and reliable solder bonds between the leadframe terminals and the underlying PCB. FIGS. 2A-2C provide an example illustration of this issue. FIG. 2A shows a bottom view of a portion of a conventional QFN package 200 after a vertical singulation cutting, showing an exposed bottom surface of a leadframe die attach pad 210 and exposed bottom surfaces 212A of a number of copper leadframe terminals 212. FIG. 2B shows an end view of QFN package 200, now positioned right-side up (with the leadframe 104 on the bottom), as viewed along direction 2B shown in FIG. 2A. The end view of FIG. 2B shows an exposed sidewall surface 212B of each leadframe terminal 212.

As discussed above, each leadframe terminal 212 may be soldered to an underlying PCB. FIG. 2C shows a cross-sectional side view of an edge portion of QFN package 200 solder-mounted on a PCB pad 220, in particular showing a solder connection 230 between a particular leadframe terminal 212 and the underlying PCB pad 220, after a solder reflow process. As shown, the solder material 230 may flow in the space between the leadframe terminal bottom surface 212A and PCB pad 220, and form a low solder fillet at the lateral edge of the leadframe terminal 212, which solder fillet extends only about 15-30% up the height of the terminal sidewall surface 212B. This may result in an ineffective or unreliable physical and/or electrical bond between the leadframe terminal 212 and PCB 220.

Various attempts have been made to improve this solder connection issue. For example, some manufacturers have added solder-enhancing coatings to surfaces that receive the solder material. FIG. 3 shows a cross-sectional side view of an edge portion of a QFN package 300 solder-mounted on a PCB pad 320, in particular showing a solder connection 330 between a particular leadframe terminal 312 and the underlying PCB pad 320, in accordance with the prior art.

In this design a notch 324 is formed at the bottom of each leadframe terminal 312 by a step cut process flow shown in FIGS. 4A-4B discussed below. As shown in the process flow, the outer surface of the notched portion of leadframe terminal 312 may be tin plated to form a tin coating 340. The tin plating 340 may enhance the wetting of the solder 330 to improve the flow of the solder material onto the exposed surfaces of leadframe terminal 312 to form an improved solder connection with leadframe terminal 312. For example, the solder 330 may form a solder fillet that extends about 50-65% up the height HT of the leadframe terminal 312.

FIGS. 4A-4B show an example process flow 400, including process steps and corresponding cross-sectional and three-dimensional views for selected process steps, for producing a group of QFN packages 300 with notched leadframe terminals 312 as shown in FIG. 3, in accordance with the prior art. More particularly, process 400 creates multiple QFN packages 300 from a leadframe strip after a singulation cut at the end of the process.

First, in the step labelled "Assembly FOL," a front-end-of-the-line (FOL) assembly process is performed to form an array of IC structures on a common leadframe. Each IC structure typically includes an array a die or chip mounted on a respective die attach pad (DAP) of the leadframe. FIG. 4A shows a portion of two IC structures, each having a respective die mounted on a respective DAP of the common leadframe.

Next, in the step labelled "Ecapsulation," the structure may be encapsulated by a mold compound. Various processing steps may then be performed, including a Post Mold Cure step, a Bottom Mark step, and a Deflash step. Then, a wide saw cut may be performed at the "Saw Step Cup" step, followed by a tin plating of the upper surface of the structure at the "Plating" step.

As shown in FIG. 4B, a 2D Mark may be performed, followed by a "Saw Isolate" cut, "Strip Test," and "Final Mark" step. The IC structures may then be singulated by a "Saw Singulate" step, which may be followed by a "Final Test" step and "Sort/Scan" step.

The cross-sectional view shown at the "Saw Singulate" step in FIG. 4B shows a pair of QFN packages 300A and 300B created by the singulation cut. As shown in the "Saw Step Cut," a wide saw cut is performed in the copper terminal structure to form a notch in the terminal structure. The tin plating process performed after the wide saw cut (Saw Step Cut step) plates the exposed surfaces of the die attach pads and the copper terminal surfaces exposed by the saw step cut. The subsequent "Saw Isolate" cut defines discrete pairs of QFN packages that are conductively isolated from each other by the isolation cut, the strip of isolated QFN packages is tested (Strip Test step), and the "Saw Singulate" cut described above is performed to singulate the QFN packages.

As shown in the "Saw Step Cut" step in FIG. 4A, the wide saw cut extends only partially through the thickness of the leadframe terminal structure to define a notch in the terminal structure with vertical sidewalls that extend only partially through (e.g., 50% through) the thickness of the leadframe terminal structure. Thus, as shown in the subsequent "Plating" step, the tin plating extends into the notch and covers the leadframe terminal sidewalls in the notch, which extends only partially across the thickness of the leadframe terminal structure.

As a result, after the thin saw cut in the "Saw Isolate" step and subsequent medium saw cut in the "Saw Singulate" step, both shown in FIG. 4B, the exposed sidewall of each leadframe terminal structure has tin plating on only a portion of the vertical thickness of the respective sidewall. Thus, as shown in the terminal end view shown at the "Saw Singulate" step (FIG. 4B), the sidewall of each leadframe terminal has a tin plated portion 340 in the area corresponding with the previously notched area of the terminal, and an exposed copper portion 312B (uncoated by tin) formed by the "Saw Singulate" cut (or by the previous "Saw Isolate" cut). Thus in this example, only 50% of the height of the leadframe terminal sidewall is covered by the solder-enhancing tin coating. Due to the leadframe terminal sidewall being only partially coated with tin (i.e., only a portion of the vertical height of the sidewall being tin plated), when a QFN package produced in this manner is subsequently soldered to a PCB, the solder material at the leadframe terminal sidewall may form a solder fillet that extends only partially up the height (e.g., about 50-65%) of the leadframe terminal sidewall, which may provide an ineffective or deficient connection to the PCB.

In contrast to flat no-leads packages, flat leads packages, for example quad-flat packages (QFPs) and small outline transistor (SOT) packages, include leads extending from the lateral sides of the package, which may be soldered to a PCB to surface mount the package to the PCB without through-holes.

FIG. 5 shows a cross-sectional view of an example flat leads package 500 (for example, a QFP or SOT package). As shown, the flat leads package 500 may include a semiconductor die (chip) 502 mounted on a leadframe 504 (e.g., copper leadframe) and encapsulated in an insulating mold compound 506. The leadframe 504 may include a die attach pad 510, on which the die 502 is mounted, and a number of leads 512, also referred to herein as leadframe terminals, extending laterally out of the mold compound 506 at the perimeter of the package 500. The die 502 may be attached to each lead (leadframe terminal) 512 by a respective wire bond 514.

Each lead 512 may be plated or otherwise coated with a coating material 520, e.g., a tin plating layer, on both an upper side and a lower side of the lead 512, and then formed or shaped to bend downward toward a bottom plane of the package 500. Each lead 512 can be solder mounted at a distal end 522 to a surface of an underlying PCB pad, to provide a physical and electrical connections between the flat leads package 500 and the PCB. As shown, the distal end 522 of each lead 512 includes an exposed end surface 524, between the upper and lower sides of the lead 512 plated by coating material 520, that remains uncoated (e.g., not tin plated). Thus, only a partial area, e.g., 50%, of the distal end 522 of each lead 512 is coated (e.g., tin plated), which may result in an ineffective or unreliable solder connection between the distal end 522 of the lead 512 and the PCB, e.g., as discussed above regarding conventional QFN packages.

FIG. 6A is a photo image of the top side of an example conventional flat leads package 500. As shown, the example flat leads package 500 includes a die or chip (not shown) encased in a mold compound 506, and four leads (leadframe terminals) 512 extending outwardly from the mold compound 506, and bent downwardly toward the bottom of the package 500. As shown, the upper side of each lead 512 may be plated with a coating material 520 (e.g., tin plating), as discussed above.

FIG. 6B shows an end view of flat leads package 500, as viewed along direction 6B shown in FIG. 6A. The end view shown in FIG. 6B shows the four leads 512 extending from one side of the package 500 and bent downwardly toward the bottom of the package 500. As shown, the distal end 522 of each lead 512 includes an exposed end surface 524 between the coating material 520 (e.g., tin plating) on the upper and lower surfaces of the lead 512. The non-plated end surface 524 may reduce the effectiveness or reliability of solder connections between the distal ends 522 of lead 512 and an underlying PCB, as discussed above.

FIG. 7 shows an example process flow 700, including process steps and corresponding cross-sectional and three-dimensional views for selected process steps, for producing a group of flat leads packages 500 (e.g., QFP or SOT packages) as shown in FIGS. 5 and 6A-6B, in accordance with the prior art. More particularly, process 700 creates multiple flat leads packages 500 from a leadframe strip after a lead forming (bending) process and singulation cut at the end of the process.

First, in the step labelled "Assembly FOL" in FIG. 7, a front-end-of-the-line (FOL) assembly process is performed to form an array of IC structures on a shared leadframe. In this example, each IC structure includes a die or chip mounted on a respective die attach pad (DAP) of the leadframe. The illustrated Assembly FOL step shows a partial cross-section showing two adjacent IC structures mounted on a leadframe, and a three-dimensional view of a portion of the leadframe including four DAPs.

Next, in the step labelled "Ecapsulation," each IC structure is encapsulated by a mold compound to define an array of mold-encapsulated IC structures, as illustrated in the cross-sectional view and corresponding three-dimensional view. Next, in the step labelled "Electro Plating," portions of the leadframe uncovered by the mold compound are plated with tin. As shown in the cross-sectional view, the top and bottom surfaces of the leadframe may be tin plated.

Next, in the step labelled "Isolate Lead," portions of the leadframe are cut away to partially separate the various mold-encapsulated IC structures from each other, and define a group of leads 512 (in the example, four leads 512) extending from opposing lateral sides of each mold-encapsulated IC structure. In addition, to the cross-sectional view and corresponding three-dimensional view, the "Isolate Lead" step includes an end view along the direction labelled EV in the three-dimensional view. The end view shows the distal ends of the four leads 512 extending from one side of a selected mold-encapsulated IC structure. As shown in the end view, the distal end 522 of each lead 512 includes an exposed end surface 524 of the lead 512 surrounded (partially or fully) by the tin plating 520. In this example, only about 50% of the surface of the distal end 522 of each lead 512 is covered by tin, due to the non-plated exposed distal end surface 524.

After the Isolate Lead step, a Strip Test step is performed, followed by a "Lead Form/Singulate" step in which (a) the leads 512 extending from each IC structure are formed, i.e., bent downwardly toward the bottom surface of the respective IC structure, and (b) the IC structures are singulated from each other to define a group of singulated IC devices 500. Again, as shown in the end view, only about 50% of the surface of distal end 522 of each lead 512 is covered by tin, which may reduce the effectiveness or reliability of solder connections between the leads 512 and an underlying PCB.

SUMMARY

Embodiments of the present invention provide methods for forming flat no-leads integrated circuit (IC) packages (e.g., dual flat no-leads (DFN) packages, quad flat no-leads (QFN) packages, etc.) and/or flat leads IC packages (e.g., quad-flat packages (QFPs), small outline transistor (SOT) packages, etc.) with leadframe surfaces that are coated with a solder-enhancing material, e.g., tin, for improved solder connection of the IC packages to a PCB or other structure.

Some embodiments involving flat no-leads packages include forming an IC package structure including a leadframe terminal structure having an exposed top or bottom surface; forming a first coating of a first coating material (e.g., tin) on the exposed top or bottom surface; cutting through a full thickness of the leadframe terminal structure to define an exposed terminal sidewall surface; and forming a second coating of a second coating material (e.g., tin) over the full height of the exposed terminal sidewall surface. The coating (e.g., tin immersion coating) covering the full height of the leadframe terminal sidewall may enhance the flow of solder material, e.g., when soldering to a PCB, to provide an improved solder connection.

One embodiment provides a method for forming an IC package, including (a) forming an IC package structure including a conductive terminal structure having an exposed terminal structure top or bottom surface; (b) forming a first coating of a first coating material on the exposed terminal structure top or bottom surface; (c) performing a first cutting process to cut through a full thickness of the conductive terminal structure to define an exposed terminal structure sidewall surface, the exposed terminal structure sidewall surface having a full height defined by the full thickness of the conductive terminal structure; and (d) forming a second coating of a second coating material over the full height of the exposed terminal structure sidewall surface.

In one embodiment, after forming the second coating of the second coating material over the full height of the exposed terminal structure sidewall surface, a second cutting process is performed to cut though the IC package structure to divide the IC package structure.

In one embodiment, the second cutting process to divide the IC package structure does not remove the second coating of the second coating material formed over the full height of the exposed terminal structure sidewall surface.

In one embodiment, the first cutting process has a first cutting width, and the second cutting process has a second cutting width smaller than the first cutting width.

In some embodiments, after the second cutting process to divide the IC package structure, a soldering process is performed on the terminal structure sidewall surface coated with the second coating material to form a solder having a solder connection area covering at least 80%, at least 80%, or 100% of the full height of the coated terminal structure sidewall surface.

In some embodiments, the first coating material and the second coating material comprise the same material, e.g., tin or other material. In other embodiments, the first coating material and the second coating material comprise different materials.

In one embodiment, forming the second coating of the second coating material over the full height of the exposed terminal structure sidewall surface comprises immersing the full height of the exposed terminal structure sidewall surface in the second coating material.

In one embodiment, forming the second coating of the second coating material over the full height of the exposed terminal structure sidewall surface comprises performing a tin immersion process to coat the full height of the exposed terminal structure sidewall surface with tin.

In one embodiment, forming the first coating of the first coating material on the exposed terminal structure top or bottom surface comprises performing a tin electroplating process; and forming the second coating of the second coating material over the full height of the exposed terminal structure sidewall surface comprises performing a tin immersion process.

In one embodiment, the exposed terminal structure sidewall surface lies in a single plane.

In some embodiments, the IC package structure comprises a no-leads package structure, e.g., a dual flat no-leads structure (DFN) or a quad flat no-leads (QFN) structure.

Another embodiment provides an IC package, e.g., a QFN package, including (a) an IC package structure including a conductive terminal having a terminal top or bottom surface and a terminal sidewall surface, the terminal sidewall surface having a height defined by a full thickness of the conductive terminal; (b) a first solder-enhancing coating covering the terminal top or bottom surface; and (c) a second solder-enhancing coating covering the full height of the terminal sidewall surface.

In one embodiment, the first solder-enhancing coating covering the terminal top or bottom surface comprises a tin electroplating coating; and the second solder-enhancing coating covering the full height of the terminal sidewall surface comprises a tin immersion coating.

In some embodiments, the IC package includes a solder having a solder connection area covering at least 80%, at least 90%, or 100% of the full height of the coated terminal sidewall surface.

Other embodiments are directed to forming flat leads packages (e.g., QFP or SOT packages) having leadframe leads with improved solder wettability. One embodiment provides a method for forming a flat leads package. An IC package structure may be formed, which includes a plurality of encapsulated IC structures formed on a common leadframe and exposed portions of the leadframe extending between adjacent encapsulated IC structures. An isolation cutting process is performed to electrically isolate the plurality of encapsulated IC structures from each other by selectively cutting through exposed portions of the leadframe, wherein the isolation cutting process defines a plurality of leadframe leads extending from each encapsulated IC structure, each leadframe lead having an exposed end surface at a distal end of the leadframe lead. After the isolation cutting process, an immersion coating process is performed to coat exposed surfaces of the leadframe leads extending from each encapsulated IC structure with a coating material, for example tin or other solder-enhancing material, including coating a full surface area of the exposed end surface at the distal end of each leadframe lead to define a fully coated distal end surface of each leadframe lead.

In some embodiments, after the immersion coating process, the leadframe leads extending from each encapsulated IC structure may be deformed or shaped toward a bottom surface of the respective encapsulated IC structure, followed by a singulation cutting process to singulate the plurality of encapsulated IC structures.

In one embodiment, the singulation cutting process comprises cutting the leadframe at locations other than at the leadframe leads defined by the isolation cutting process, and does not remove the coating material on the exposed end surface at the distal end of each leadframe lead.

In one embodiment, after the singulation cutting process to singulate the plurality of encapsulated IC structures, a soldering process is performed to solder the distal end of each tin-coated leadframe lead to a PCB, wherein the tin coating improves the solder wettability and provides a solder having a solder connection area covering at least 80%, at least 90%, or a full 100% of the full height of the distal end surface of the lead.

In one embodiment, the immersion coating process involves immersing all exposed surfaces of each leadframe lead extending from the selected leadframe lead in the solder-enhancing coating material (e.g., tin).

In one embodiment, the plurality of encapsulated IC structures comprises quad flat packages (QFPs). In another embodiment, the plurality of encapsulated IC structures comprises small outline transistor (SOT) packages.

Another embodiment provides a system including a printed circuit board (PCB) and a flat leads integrated circuit (IC) package (e.g., a QFP or SOT package) mounted to the PCB. The IC package includes an encapsulated IC device and a plurality of conductive leads extending out from the encapsulated device, each conductive lead having a distal end with a distal end surface, and a solder-enhancing coating (e.g., tin immersion coating) fully covering the distal end surface of each conductive lead. At least one conductive lead of the IC package is solder mounted to the PCB by a solder between the distal end of the respective conductive lead and the PCB, wherein each solder between the distal end of a respective conductive lead and the PCB has a solder connection area covering at least 80% of a full height of the respective distal end surface.

In one embodiment, all surfaces of each conductive lead extending out from the encapsulated device are covered by the solder-enhancing coating, e.g., tin.

BRIEF DESCRIPTION OF THE DRAWINGS

Example aspects and embodiments of the present disclosure are described below in conjunction with the following appended drawings:

FIG. 10 is a table showing some example tin thickness dimensions for four example tin immersion durations, according to one example embodiment;

DETAILED DESCRIPTION

Embodiments of the present invention provide integrated circuit (IC) packages, for example but not limited to flat no-leads packages (e.g., dual flat no-leads (DFN) or quad flat no-leads (QFN) packages) and/or flat leads packages (e.g., quad-flat packages (QFPs) and small outline transistor (SOT) packages) with improved wettable leadframe surfaces for improved solder connections between the packages and a PCB, and methods of forming such IC packages. In some embodiments the full height of each leadframe surface to be soldered to the PCB, for example—leadframe terminal sidewall surfaces in the case of flat no-leads packages, or distal end surfaces of leadframe leads in the case of flat leads packages—may be coated or otherwise covered with tin or other solder-enhancing material. As used herein, a "solder-enhancing material" refers to a material that improves or enhances a solder connection between a leadframe surface and a PCB or other structure, e.g., as compared with a solder connection between an uncoated leadframe surface and the PCB or other structure. In some embodiments a tin immersion process is performed to coat the full height of each leadframe surface to be soldered to a PCB. The solder-enhancing coating (e.g., tin) covering the full height of the leadframe surface may enhance the flow of the solder material onto the leadframe surface to form an improved solder connection between the leadframe surface and underlying PCB. For example, as discussed and shown below, the solder may form a solder fillet that extends at least 80%, at least 90%, or 100% up the height of the respective leadframe surface, to thereby provide an improved solder connection between the IC package and the PCB.

FIGS. 8A-8E illustrate an example process 800 for forming flat no-leads packages having improved leadframe terminal wettability for improved soldering of the packages to a PCB, according to an example embodiment of the present invention. The no-leads packages may be DFN packages, QFN packages, or any other suitable type of packages. Each of FIGS. 8A-8E shows a cross-sectional view of each processing step (left side of the respective figure), along with a corresponding view showing the result of each processing step (right side of the respective figure).

Figure 8A:
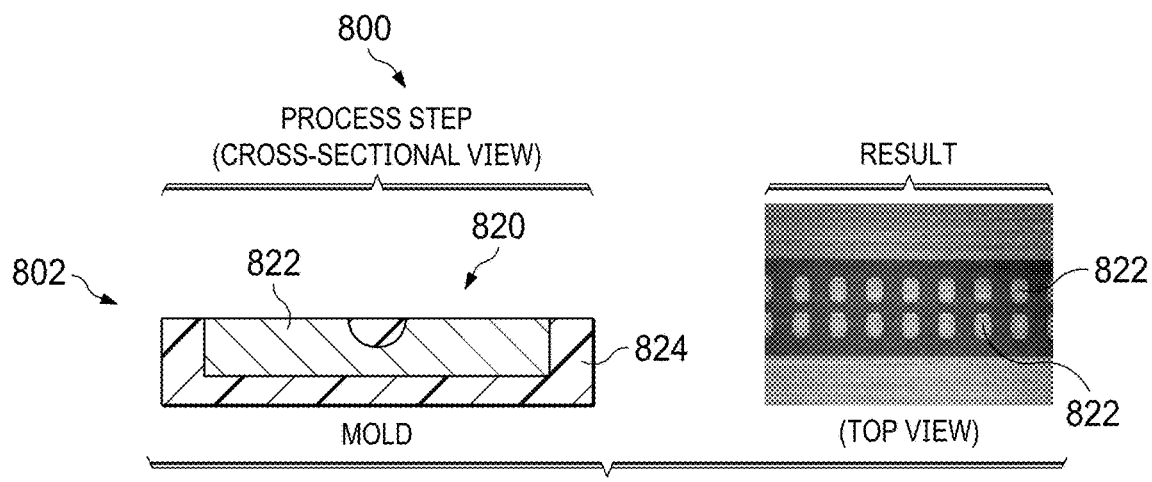
FIGS. 8A-8E illustrate an example process for forming QFN packages having improved leadframe terminal wettability for improved soldering of the QFN packages to a PCB, according to an example embodiment of the present invention.

As shown in FIG. 8A, step 802 of process 800, an IC package structure 820 may be formed. IC package structure 820 may include a leadframe strip 822, a die/chip mounted on each die attach pad of the leadframe strip 822, and a mold compound 824 formed around the structure. The cross-sectional view shows a portion of the leadframe strip 822 corresponding with a pair of leadframe terminals (after subsequent processing and singulation). The corresponding "Result" image is a top view showing two rows of exposed leadframe terminal surfaces.

Figure 8B:
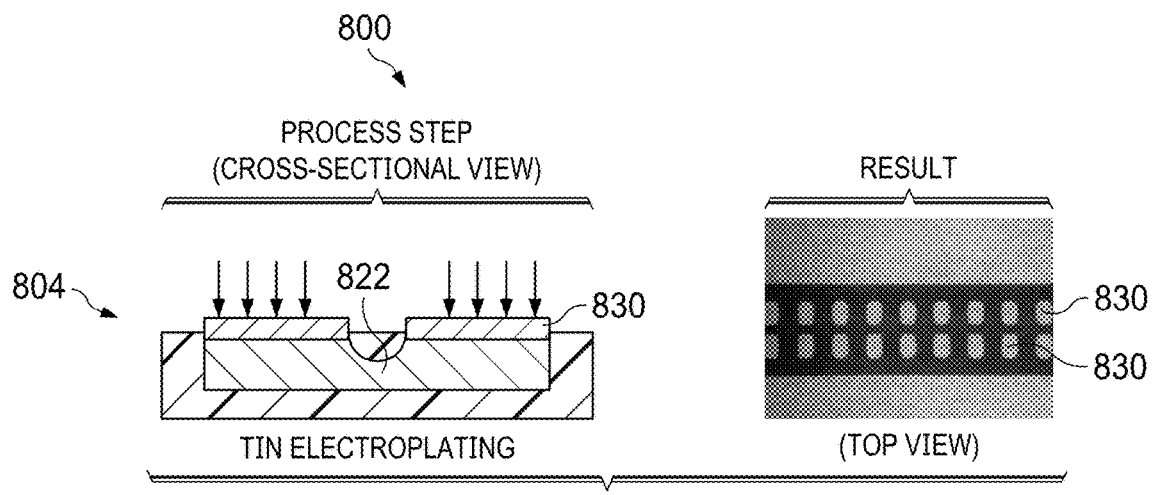

Referring next to FIG. 8B, step 804 of process 800, the exposed top surfaces of the leadframe strip 822 may be coated with a first coating material 830, e.g., tin or other solder-enhancing material. In the illustrated example, a tin electroplating process is performed to coat the exposed top surfaces of the leadframe strip 822 with tin. The tin plating formed at 804 may have a thickness in the range of 300-1000 μinch, or other suitable thickness.

It should be understood that although the explains discussed herein are largely directed to tin coatings (e.g., at steps 804 and 808 of method 800, steps 910 and 916 of method 900, and step 1206 of method 1200, any other solder-enhancing material or materials may be used to plate or coat the relevant structures in accordance with the present invention, to provide improved solder wettability and/or improved quality of solder connections.

Figure 8C:
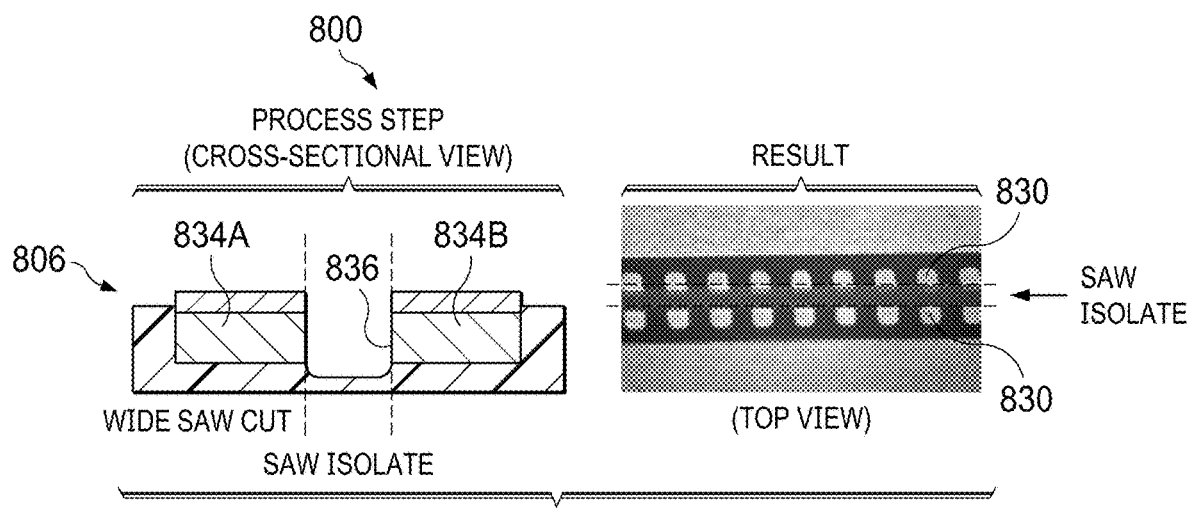

Referring next to FIG. 8C, step 806 of process 800, a wide isolation saw cut may be performed through the leadframe strip 822 to define discrete pairs of leadframe terminals 834 (one pair of terminals 834A and 834B are shown in FIG. 8C), but without cutting completely though the IC package structure 820 to singulate individual IC packages. The isolation saw cut defines exposed (copper) sidewalls of each leadframe terminal 834, indicated at 836. Unlike in certain prior art methods that form a leadframe terminal sidewall with a stepped surface, with the example method 800 (as well as example method 900 discussed below), the full surface of each exposed leadframe terminal sidewall 836 defined by the isolation saw cut may reside in a single plane, as shown in FIG. 8C.

Figure 8D:
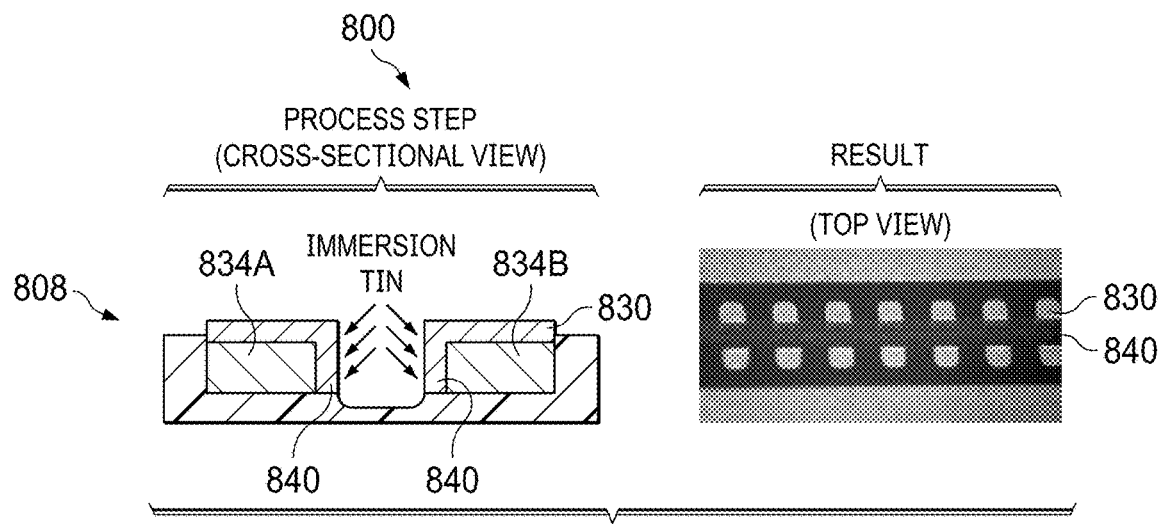

Referring next to FIG. 8D, step 808 of process 800, the exposed sidewalls 836 of the leadframe terminals 834 are coated with a second coating material 840, e.g., tin or other solder-enhancing material. The second coating material 840 may be the same as, or different, material than the first coating material 830. In some embodiments, both the first and second coating materials consist of or comprise tin. In the illustrated example, a tin immersion process is performed to coat the entire exposed surface areas of the terminal sidewalls 838. The tin immersion may also coat the first coating material 830 (e.g., tin) previously formed on the top surfaces of the leadframe strip 822 at 804.

Figure 8E:
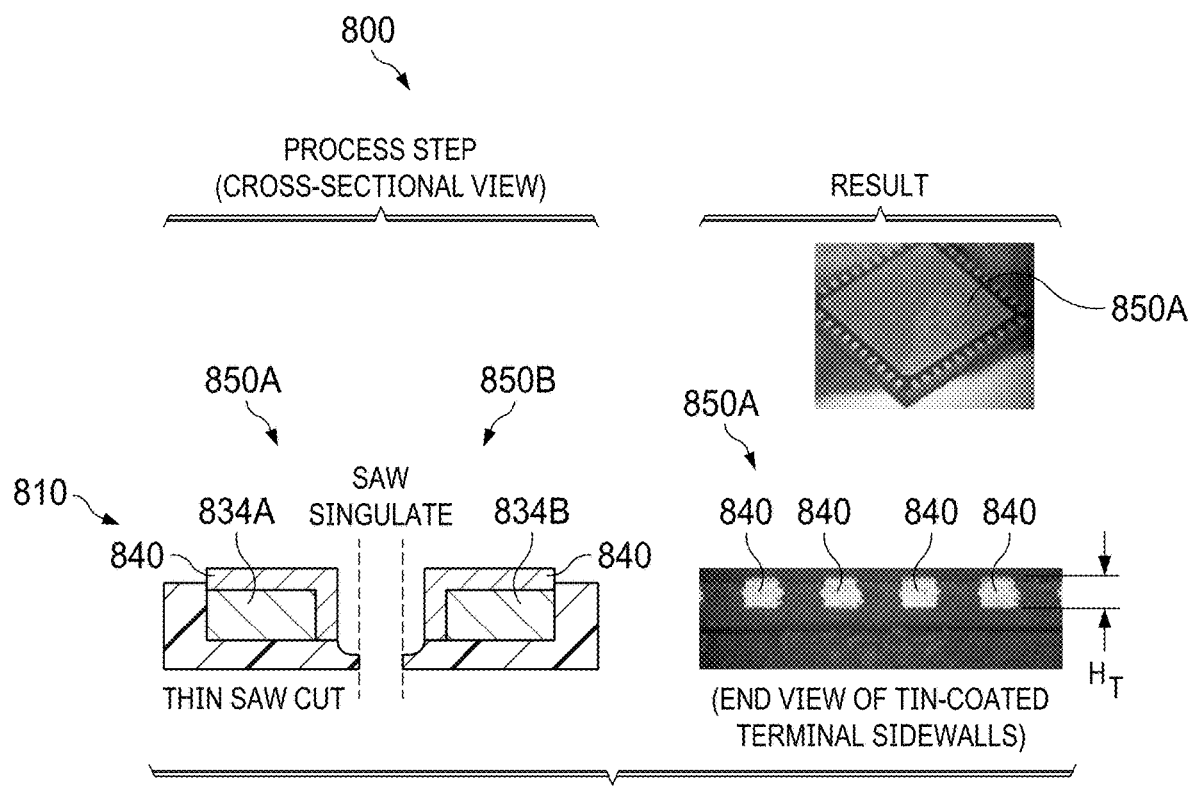

Referring next to FIG. 8E, step 810 of process 800, a saw cut singulation may be performed to singulate the structure into multiple discrete IC packages 850A, 850B (e.g., multiple discrete DFN or QFN packages). The cross-sectional view shows a pair of IC packages 850A and 850B defined by the singulation saw cut. The width of the singulation saw cut may be narrower than the isolation saw cut at 806, in order to leave the second coating material 840 (e.g., tin) intact on the leadframe terminal sidewalls 836. The corresponding "Result" images show (a) a three-dimensional view of the bottom side of one IC package 850A, and (b) an end view of a tin-coated leadframe terminal sidewalls 836 along one perimeter edge of the IC package 850A. As shown, the full height of the leadframe terminal sidewalls 836, indicated at HT, is coated with the second coating material 840, e.g., tin.

In alternative embodiments, at least one solder-enhancing coating material other than tin may be applied at step 804 (electroplating) and/or step 808 (immersion). In some embodiments, different solder-enhancing coating materials may be applied at steps 804 (electroplating) and 808 (immersion).

Figure 9A:
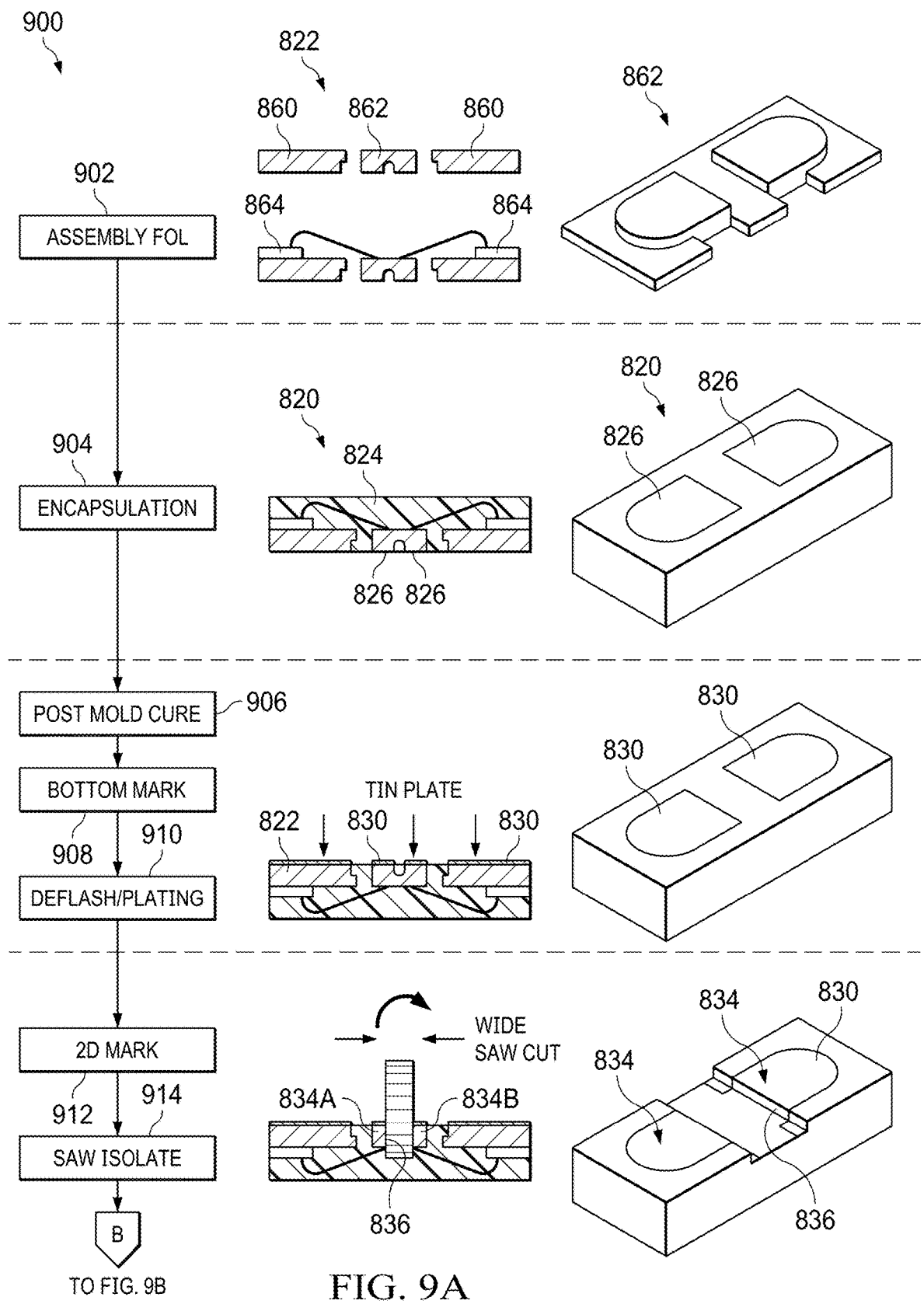
FIGS. 9A-9B illustrate a more detailed example process flow for forming QFN packages having improved leadframe terminal wettability for soldering the QFN packages to a PCB, according to an example embodiment of the present invention.
Figure 9B:
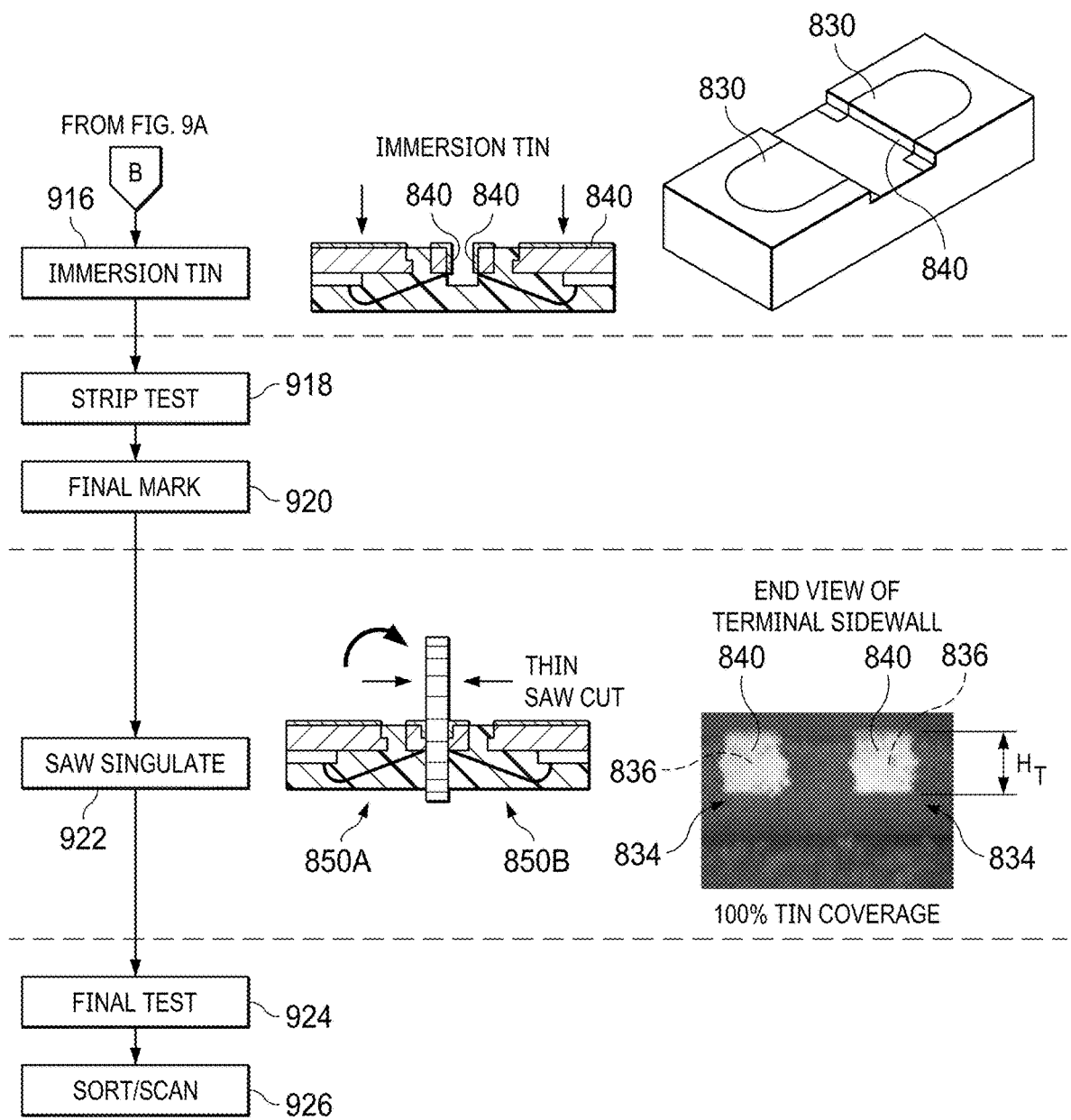

FIGS. 9A-9B illustrate another example process flow 900 for forming flat no-leads packages (e.g., DFN or QFN packages) having improved leadframe terminal wettability for soldering each IC package to a PCB, according to an example embodiment of the present invention. Process flow 900 may represent a more detailed version of the example process flow 800 shown in FIGS. 8A-8E. Figure FIGS. 9A-9B show a cross-sectional view at each step of the process 900, along with three-dimensional views of the IC structure at selected steps in the process 900.

As shown in FIG. 9A, process 900 may begin with a leadframe strip 822 including a plurality of die attach pads 860 and leadframe terminal structures 862. At 902, a front-of-line (FOL) or front-end-of-line (FEOL) assembly process may be performed, including mounting an IC die/chip 864 on each die attach pad 860 and wire bonding the IC dies/chips 864 to respective leadframe terminal structures 862.

At 904, the structure may be encapsulated in a mold compound 824 to define an IC package structure 820, and the IC package structure 820 may then be turned over for further processing. The mold encapsulation may be performed such that top surfaces 826 of the leadframe strip 822 are exposed through the mold 824.

A post-mold cure may be performed at 906, followed by a bottom mark step to identify the package lot number by laser marking at 908. A deflash and tin electroplating process may be performed on the top side of IC package structure 820 at 910, e.g., to plate the exposed copper surfaces of leadframe strip 822 with a layer of tin 830. In some embodiment, the tin plating formed at 910 may have a thickness in the range of 300-1000 μinch, or other suitable thickness.

Figure 1:
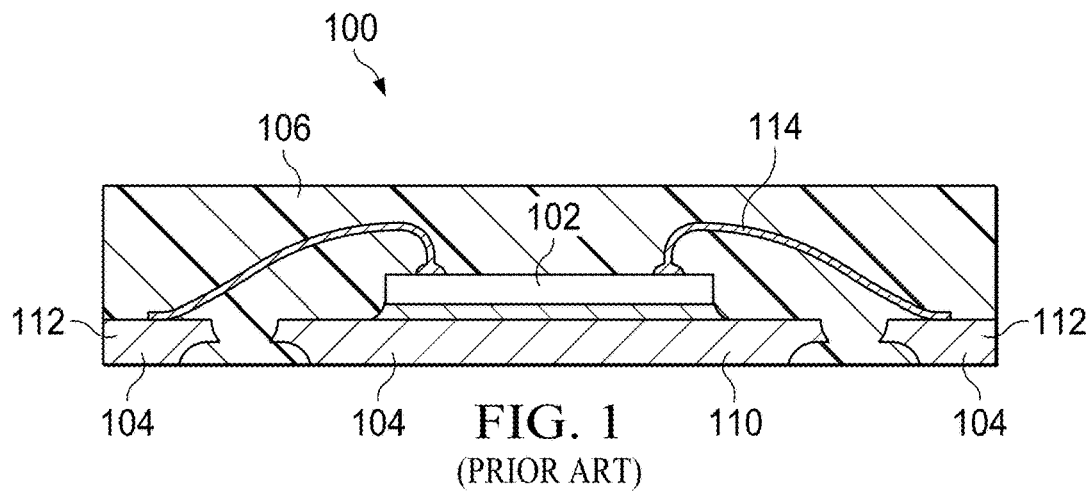
FIG. 1 shows a cross-sectional view of an example conventional QFN package.
Figure 2A:
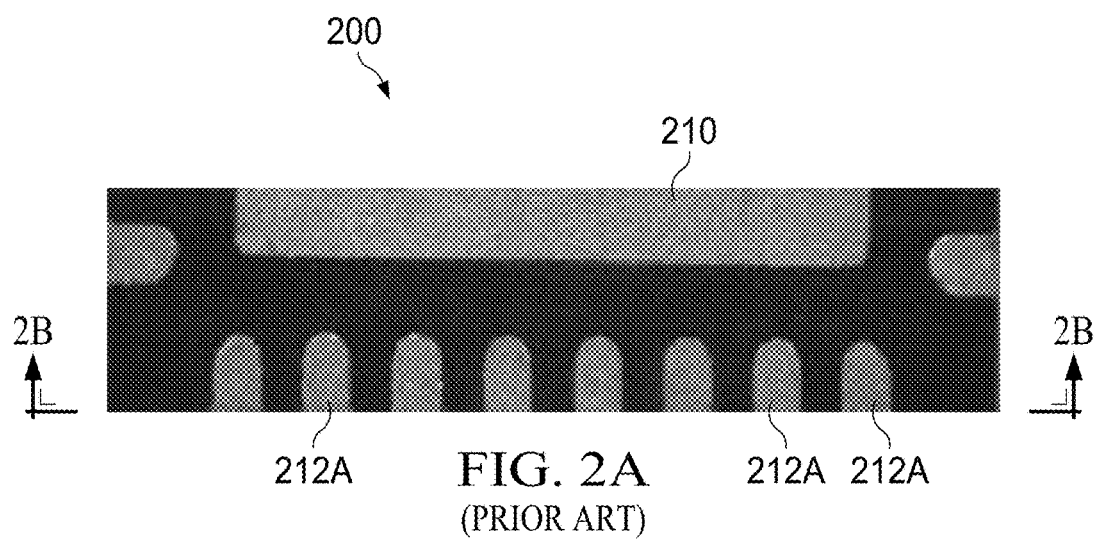
FIG. 2A shows a bottom view of a portion of a conventional QFN package after a vertical singulation cutting.
Figure 2B:
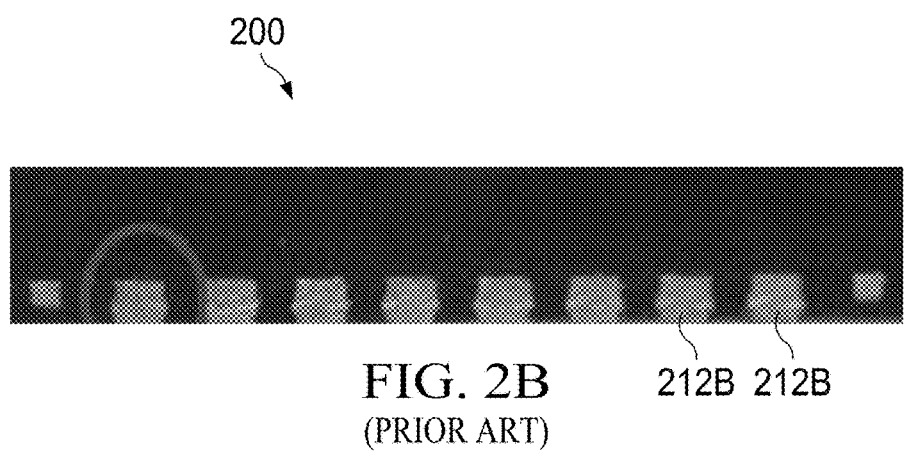
FIG. 2B shows an end view of the QFN package of FIG. 2A, positioned right-side up (with the leadframe on the bottom), as viewed along direction 2B shown in FIG. 2A.
Figure 2C:
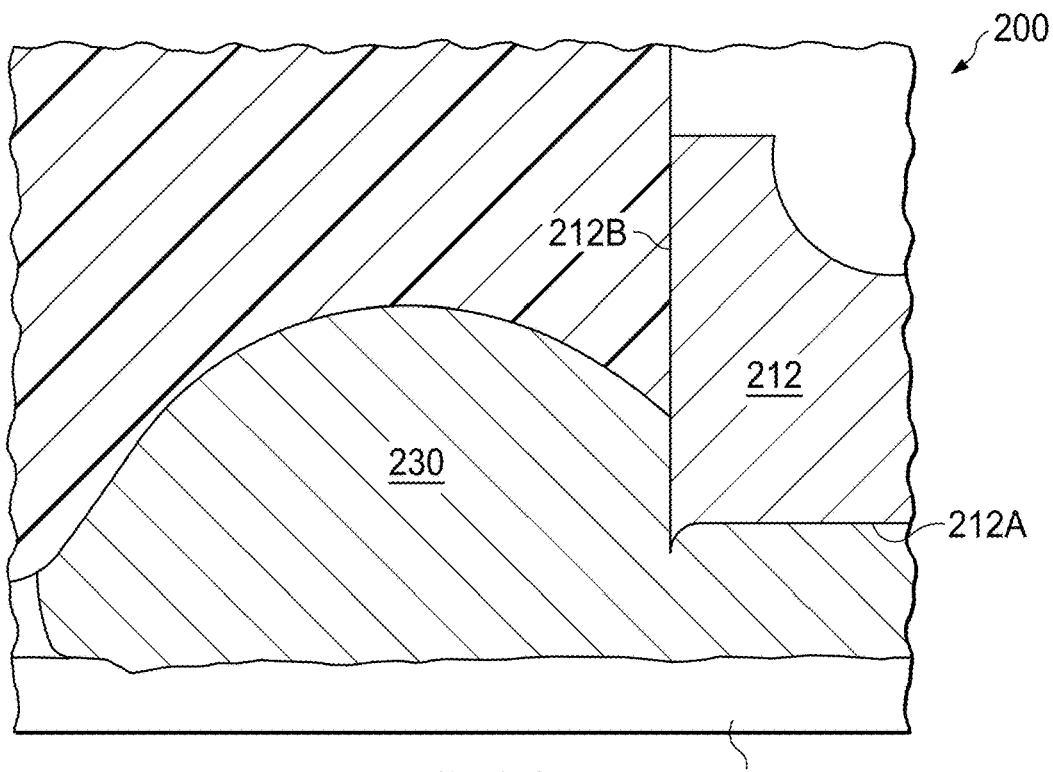
FIG. 2C shows a cross-sectional side view of an edge portion of the QFN package of FIG. 2A, showing a solder connection between a leadframe terminal and underlying PCB pad.
Figure 3:
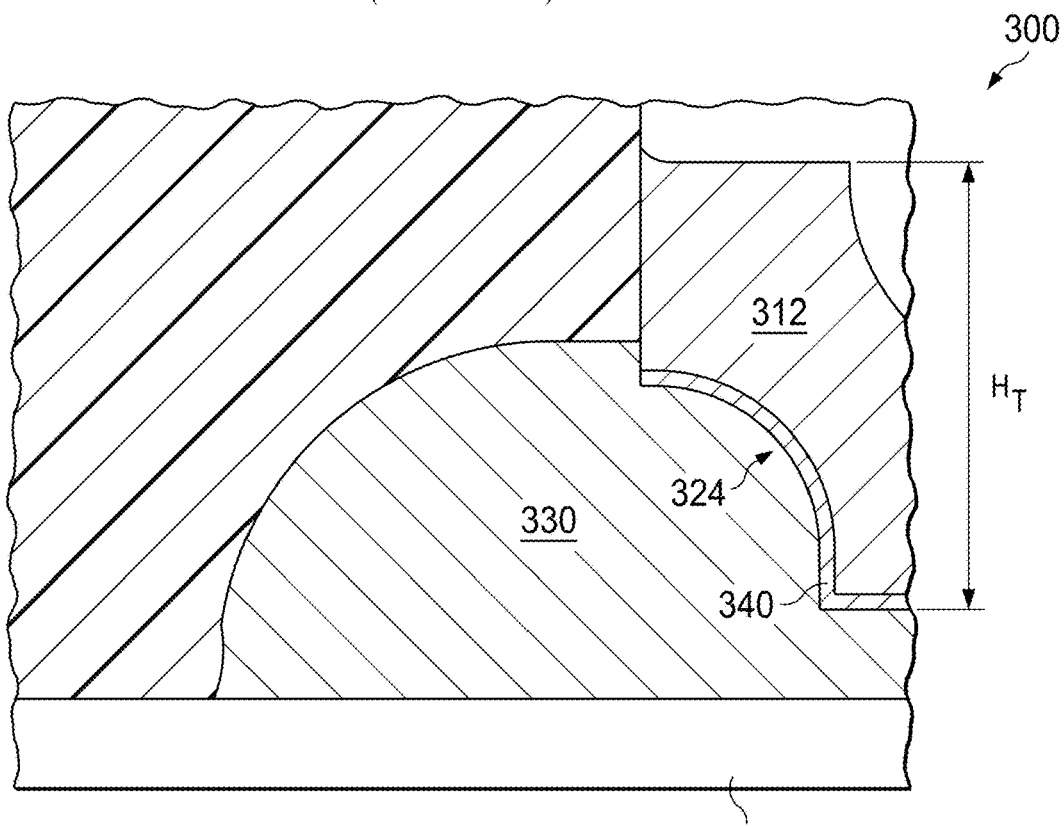
FIG. 3 shows a cross-sectional side view of an edge portion of a QFN package solder-mounted on a PCB pad, according to the prior art.
Figure 4A:
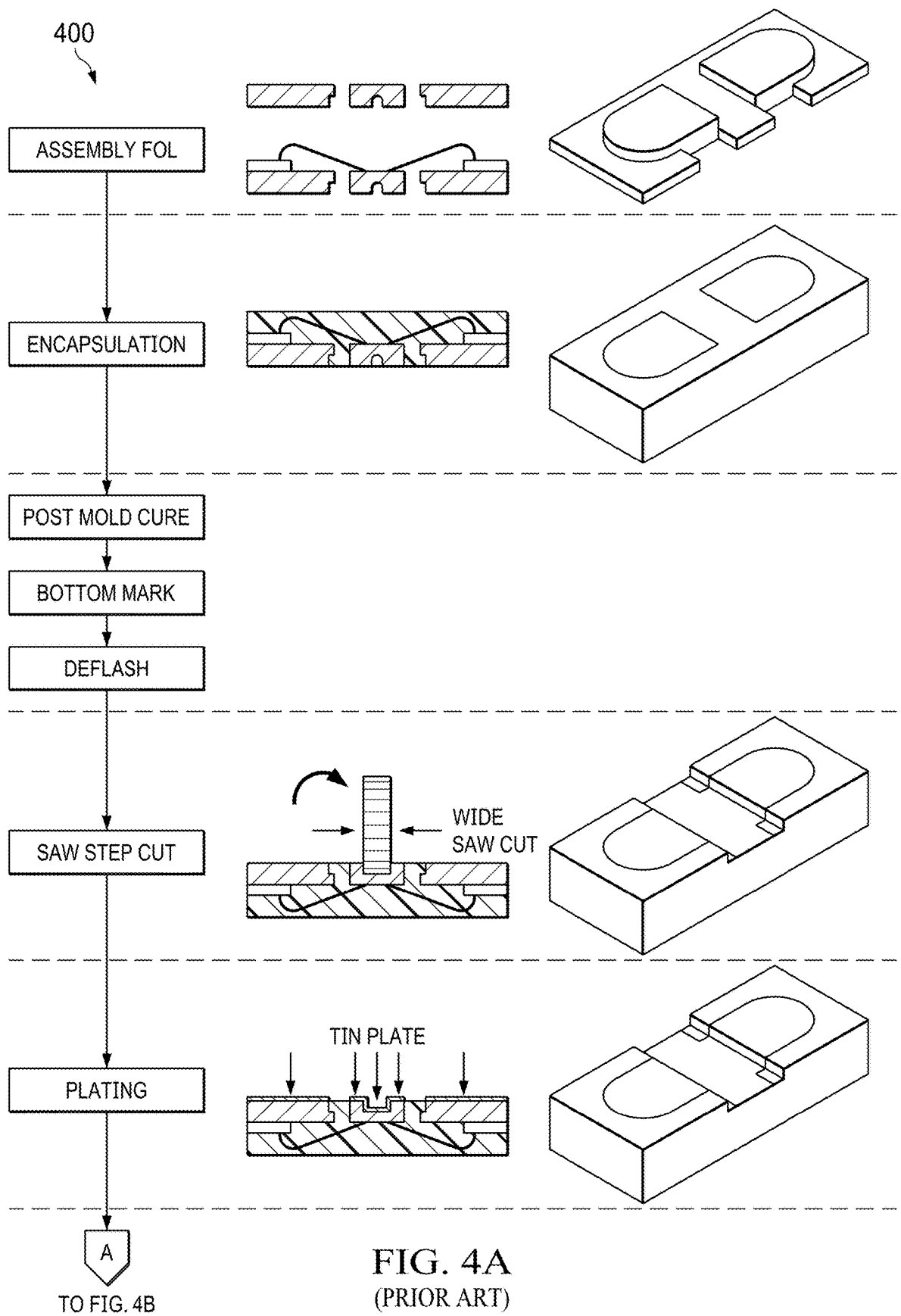
FIGS. 4A-4B show an example process flow, including process steps and corresponding cross-sectional and three-dimensional views for selected process steps, for producing a group of QFN packages with notched terminals, e.g., as shown in FIG. 3, according to the prior art.
Figure 4B:
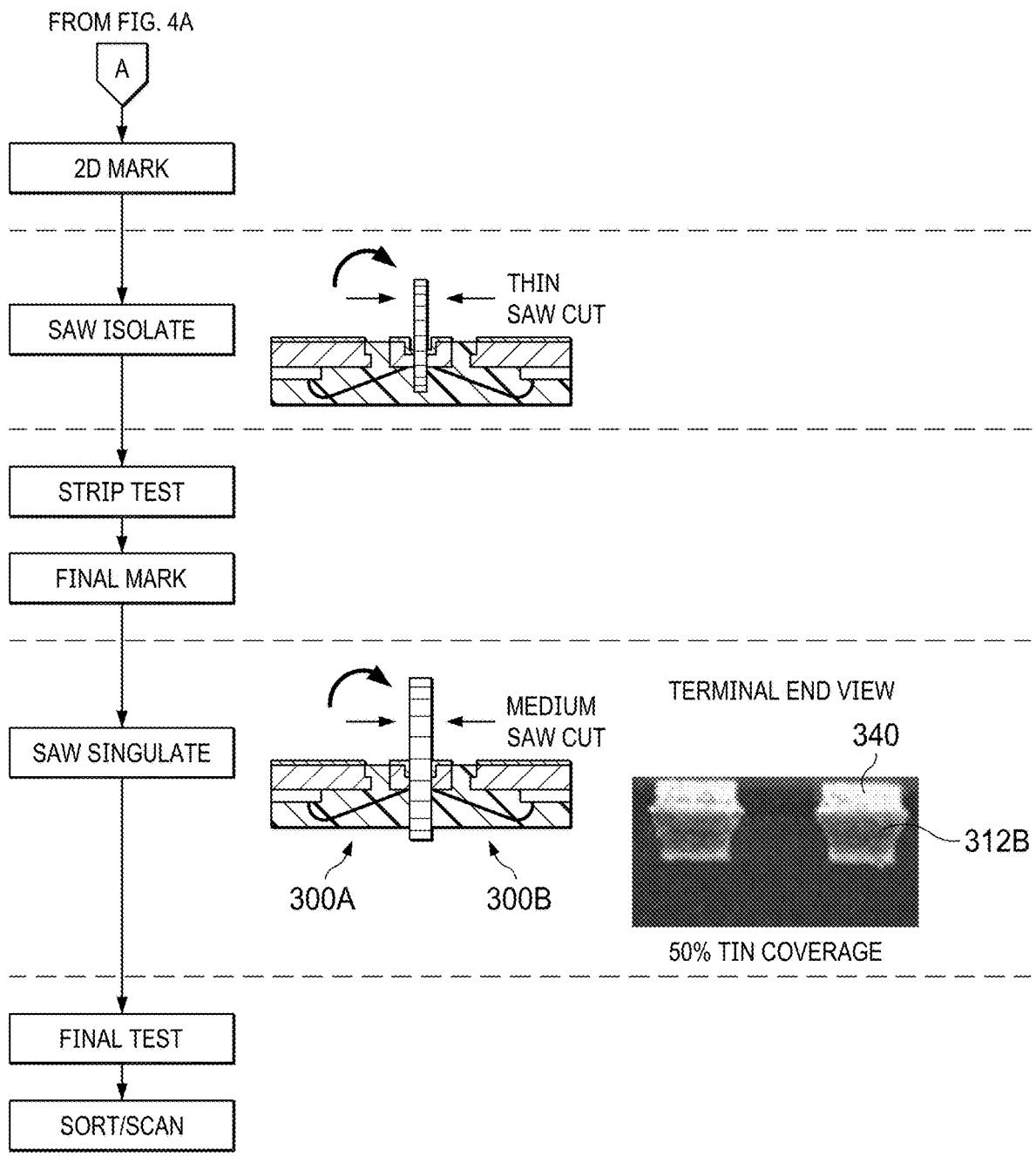
Figure 5:
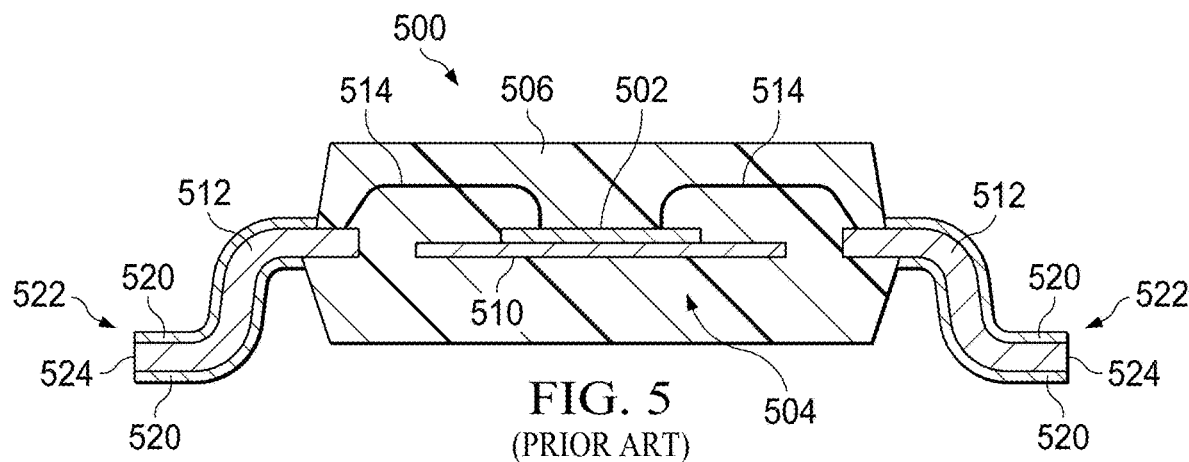
FIG. 5 shows a cross-sectional view of an example conventional flat leads package, e.g., a QFP or SOT package.
Figure 6A:
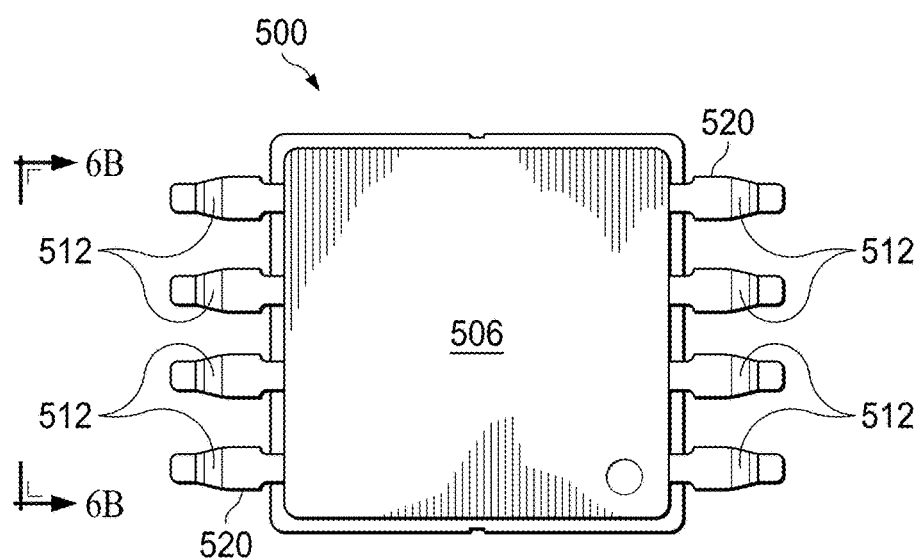
FIG. 6A shows a top view of a conventional flat leads package after singulation.
Figure 6B:
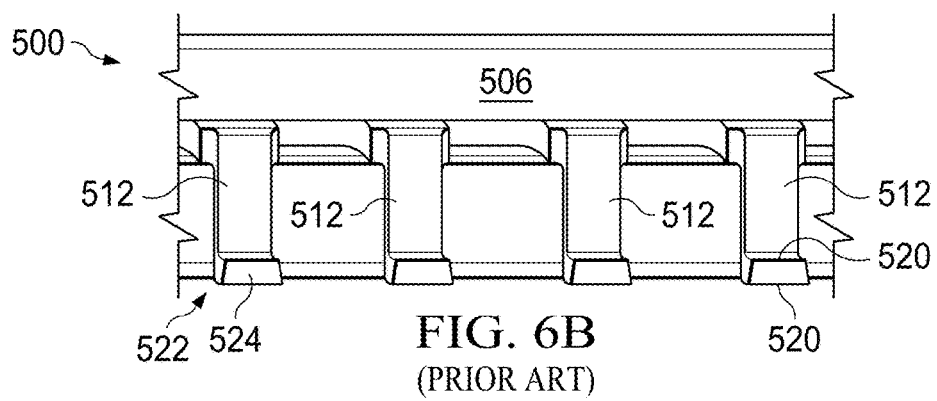
FIG. 6B shows an end view of the flat leads package of FIG. 6A, showing four leads extending from the molded package, as viewed along direction 6B shown in FIG. 6A.

A 2-D marking step may be performed at 912, to laser mark a 2-D matrix code and create strip mapping for use in a subsequent strip test process. At 914, a wide isolation saw cut may be performed through the leadframe strip 822 to define discrete pairs of leadframe terminals 834A and 834B separated by the wide saw cut. The isolation saw cut defines exposed (copper) sidewalls of the leadframe terminals 834, indicated at 836. Thus, unlike the prior art method shown in FIGS. 4A-4B which includes a wide saw step cut (to form a notch in the leadframe terminal structure) and a subsequent thin isolation saw cut to form "isolated" pairs of IC packages that can be strip tested, example method 900 may omit the wide saw step cut (for forming a notch) and instead perform a wide saw isolation saw cut to expose the full height of the leadframe terminal sidewalls 836.

A tin immersion process may then be performed at 916, to coat the surfaces of the leadframe with tin, to thereby (a) add to the thickness of the tin plating layer 830 formed on top surfaces 826 at step 910 and (b) form a tin coating layer 840 on the leadframe terminal sidewall surfaces 836 exposed by the isolation cut at step 914. The tin immersion process may utilize any suitable parameters, e.g., temperature, time, concentration, etc., to form any desired thickness of the tin coating layer 840 on leadframe terminal sidewall surfaces 836.

For example, in some embodiments, the tin immersion process may be performed using an immersion time in the range of 5 min to 2 hours; 10 min to 1 hour; 20 min to 1 hour; 30 min to 1 hour; 40 min to 1 hour; 5-20 min; 10-20 min; 15-30 min; 20-40 min; 30-50 min; or 40-50 min.

In some embodiments, the tin immersion process may utilize any suitable parameters to form a tin coating layer 840 having a minimum thickness, over the area of the leadframe terminal sidewall surfaces 836, in the range of 20-150 μin; 30-100 μin; 30-80 μin; 40-100 μin; 50-100 μin; 60-100; 70-100 μin; 80-100 μin; or at least 100 μin. In some embodiments, the tin immersion process may utilize any suitable parameters to form a tin coating layer 840 having an average thickness, over the area of the leadframe terminal sidewall surfaces 836, in the range of 20-200 μin; 30-150 μin; 40-120 μin; 40-80 μin; 50-120 μin; 60-120; 70-120 μin; 80-120 μin; at least 30 μin; at least 40 μin; at least 50 μin; at least 60 μin; at least 70 μin; at least 80 μin; at least 90 μin; or at least 100 μin.

FIG. 10 shows a table 1000 showing some example tin thickness dimensions for four example tin immersion durations, according to one example embodiment.

After the tin immersion at 916, a strip test may be performed at 918 to test the IC packages in the strip form. A final mark may be performed at 920 to laser mark the top of the IC packages, followed by singulation saw cut at 922 to singulate the structure into multiple discrete IC packages 850A, 850B (e.g., multiple discrete DFN or QFN packages). The cross-sectional view at step 922 shows a pair of IC packages 850A and 850B defined by the singulation saw cut. In some embodiments, the width of the singulation saw cut may be narrower than the isolation saw cut at 914, in order to leave at least a portion of the tin immersion coating 840 intact on the leadframe terminal sidewalls 836. For example, the width of the singulation saw cut may be narrower than the lateral distance of the opening between the tin immersion coatings 840 on the opposing terminal sidewalls 836, to thereby leave the full thickness of the tin immersion coatings 840 intact on the leadframe terminal sidewalls 836.

In alternative embodiments, at least one solder-enhancing coating material other than tin may be applied at step 910 (electroplating) and/or step 916 (immersion). In some embodiments, different solder-enhancing coating materials may be applied at steps 910 (electroplating) and 916 (immersion).

FIG. 9B also shows an end view of the singulated IC package 850A after the singulation cut at step 922, which shows the sidewalls 836 of two adjacent leadframe terminals 834, coated by the tin immersion layer 840. In the illustrated example, the full height HT of each leadframe terminal 834 is coated with tin 840, in contrast with prior methods discussed above.

Figure 11:
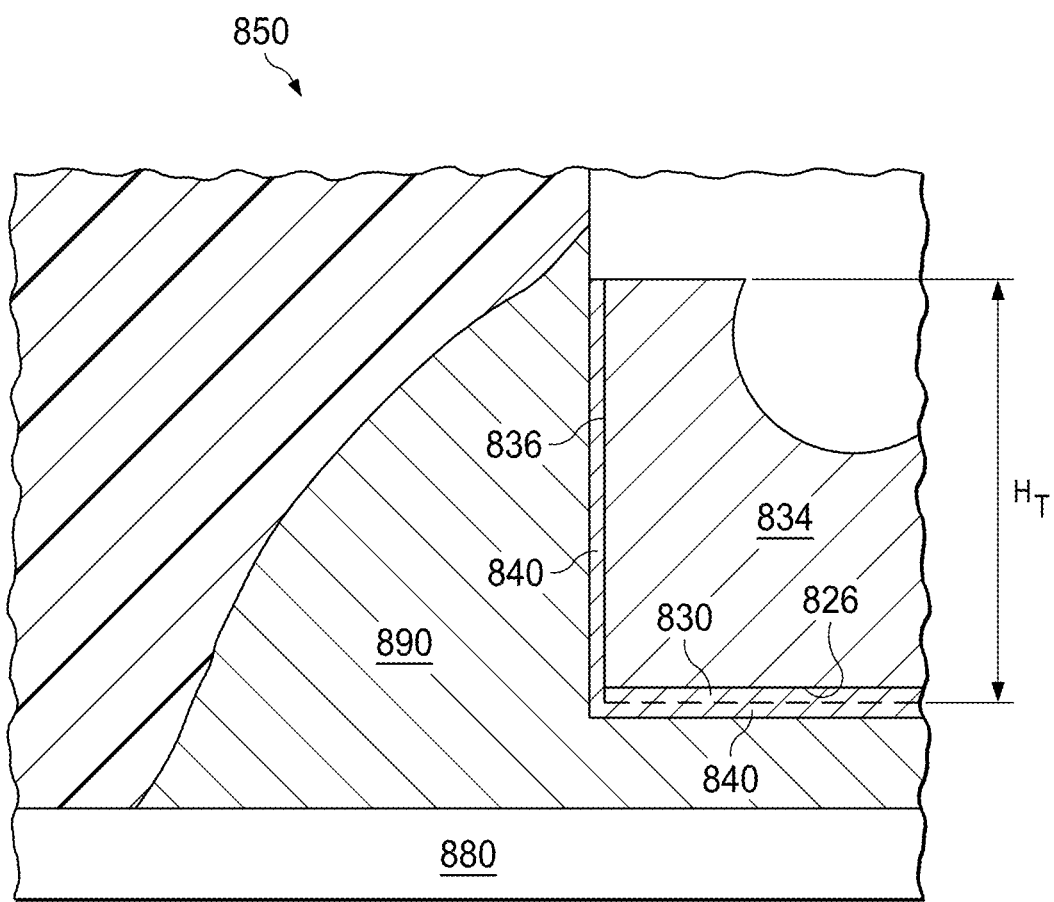
FIG. 11 is a cross-sectional view of the end of a leadframe terminal of a QFN package produced according to the example method shown in FIGS. 9A-9B, and solder connected to an underlying PCB pad, according to one example embodiment of the invention.

FIG. 11 is a cross-sectional view of a portion of an electronic device including a flat no-leads package solder-mounted to a PCB, according to one embodiment. In particular, FIG. 11 shows the end of one leadframe terminal 834 of the no-leads package, produced according to the example method 800 shown in FIGS. 9A-9B, solder connected to an underlying PCB pad 880, according to one example embodiment of the invention. As shown, the bottom surface 826 and sidewall surface 836 of the leadframe terminal 834 have been coated with tin to enhance the solder connection. In particular, bottom surface 826 may be coated by a tin plating layer 830 (steps 804, 910 discussed above) and tin immersion layer 840 (steps 808, 516 discussed above), while terminal sidewall surface 836 is coated by the tin immersion layer 840 (steps 808, 916 discussed above). As shown, the full height HT of the terminal sidewall surface 836 may be coated with tin 840, to enhance the solder wetting and/or quality of a resulting solder connection. As discussed above, providing the tin coating 840 on the full height of the terminal sidewall 836 may enhance the flow of the solder material to form a solder fillet 890 that extends at least 80%, at least 90%, or 100% up the full height HT of the terminal sidewall surface 836, to thereby provide improved solder wettability and/or improved solder connection. In the example shown in FIG. 11, the resulting solder fillet extends 100% up the height HT of the terminal sidewall surface 836.

In addition to the disclosed techniques for forming flat no-leads packages, e.g., QFN packages, having improved lead wettability for improved soldering, the inventors have also developed inventive techniques for forming flat leads packages, e.g., QFP or SOT packages, having improved lead wettability for improved soldering.

FIGS. 12A-12D illustrate an example process 1200 for forming flat leads packages, e.g., QFP or SOT packages, having improved lead wettability for improved soldering of the flat leads packages to a PCB, according to an example embodiment of the present invention. Each of FIGS. 12A-12D shows a cross-sectional view of each processing step (left side of the respective figure), along with a corresponding view or views showing the result of each processing step (right side of the respective figure).

Figure 12A:
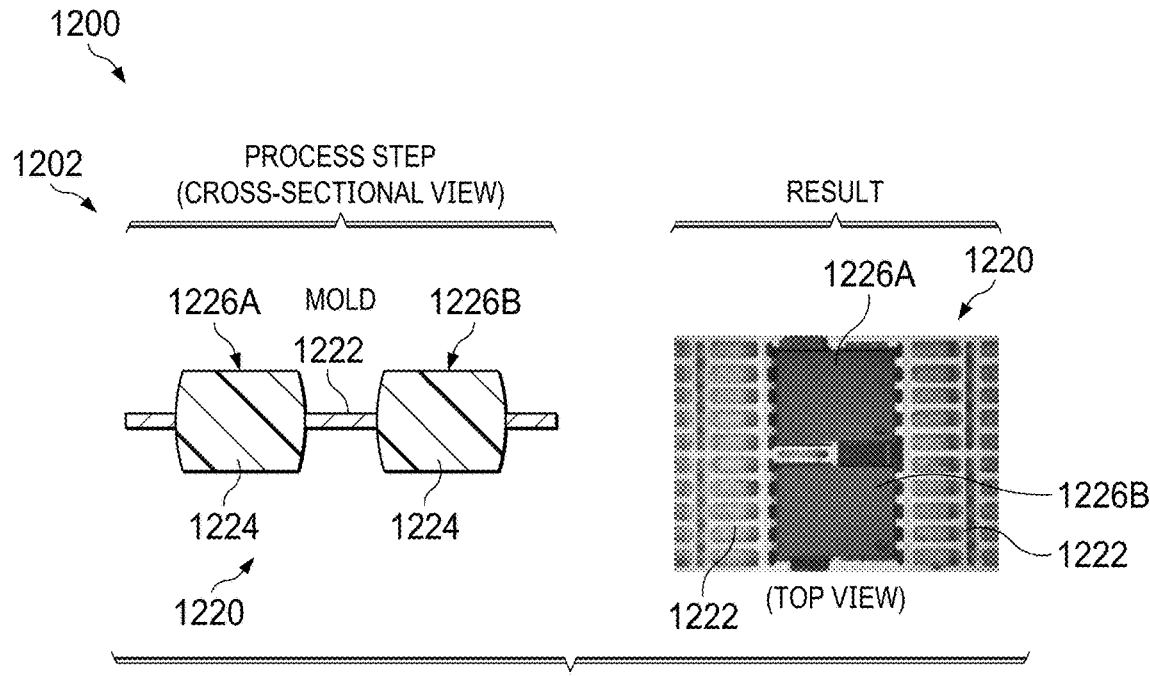
FIGS. 12A-12D illustrate an example process for forming flat leads packages (e.g., QFP or SOT packages) having improved lead wettability for improved soldering of the flat leads packages to a PCB, according to an example embodiment of the present invention.

As shown in FIG. 12A, step 1202 of process 1200, an IC package structure 1220 may be formed. IC package structure 1220 may include an array of dies/chips, each mounted on a respective die attach pad (DAP) of a common leadframe, and each mounted die/chip being encapsulated by molding compound to define an array of encapsulated IC structures. FIG. 12A, step 1202, shows two of such encapsulated IC structures 1226A and 1226B, each including a mounted die/chip encapsulated by a mold compound 1224, and both formed on a common leadframe 1222. As shown, exposed portions of the leadframe 1222 extend between adjacent encapsulated IC structures. Step 1202 may correspond with the Assembly FOL and Encapsulation steps of the process shown in FIG. 7.

Figure 12B:
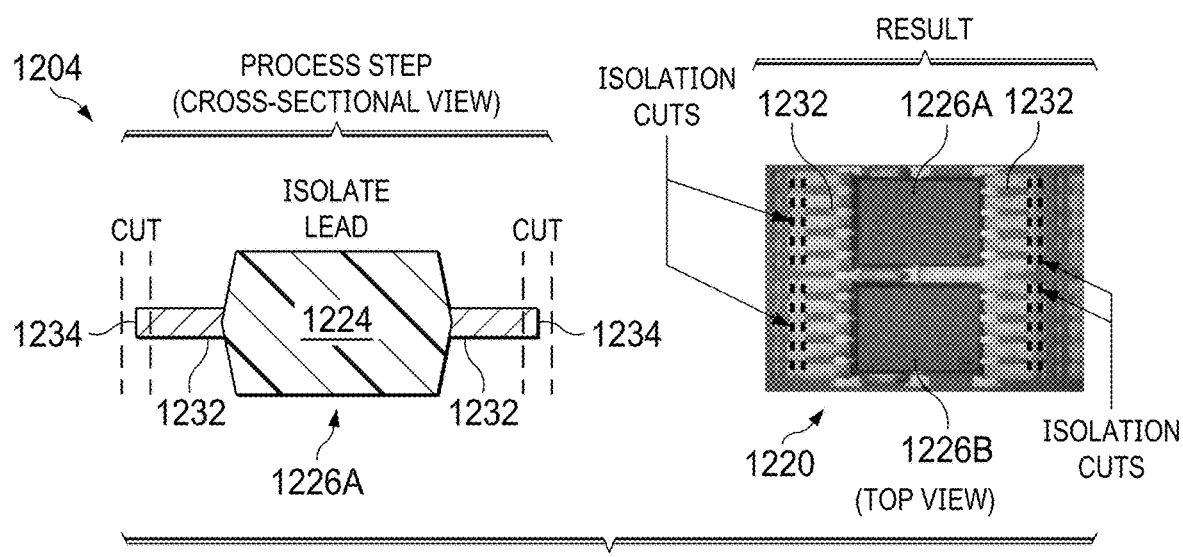

Next, as shown in FIG. 12B, a lead isolation step may be performed at step 1204, in which the leadframe 1220 is cut at selected locations (and through the full height/thickness of the leadframe) to electrically isolate individual encapsulated IC structures or subsets of encapsulated IC structures from each other, to allow operational testing of the various IC structures. The isolation cutting process may leave other selected portions of the leadframe 1220 uncut, such that the electrically isolated IC structures remain physically connected to each other. The isolation cutting process may define a group of leads 1232 extending from opposing lateral sides of each encapsulated IC structure, such that the cut distal end of each lead 1232 defines an exposed end surface 1234. The cross-sectional view (left side) shows selected isolation cut lines that isolate the encapsulated IC structure 1226A and define leads 1232 extending from opposing lateral sides of the encapsulated IC structure 1226A. As shown, the isolation cuts define an exposed end surface 1234 at the distal end of each lead 1232. The corresponding top view (right side) shows isolation cuts through the leadframe 1220 that isolate encapsulated IC structures 1226A and 1226B, and define leads 1232 extending from each encapsulated IC structure 1226A and 1226B.

Figure 12C:
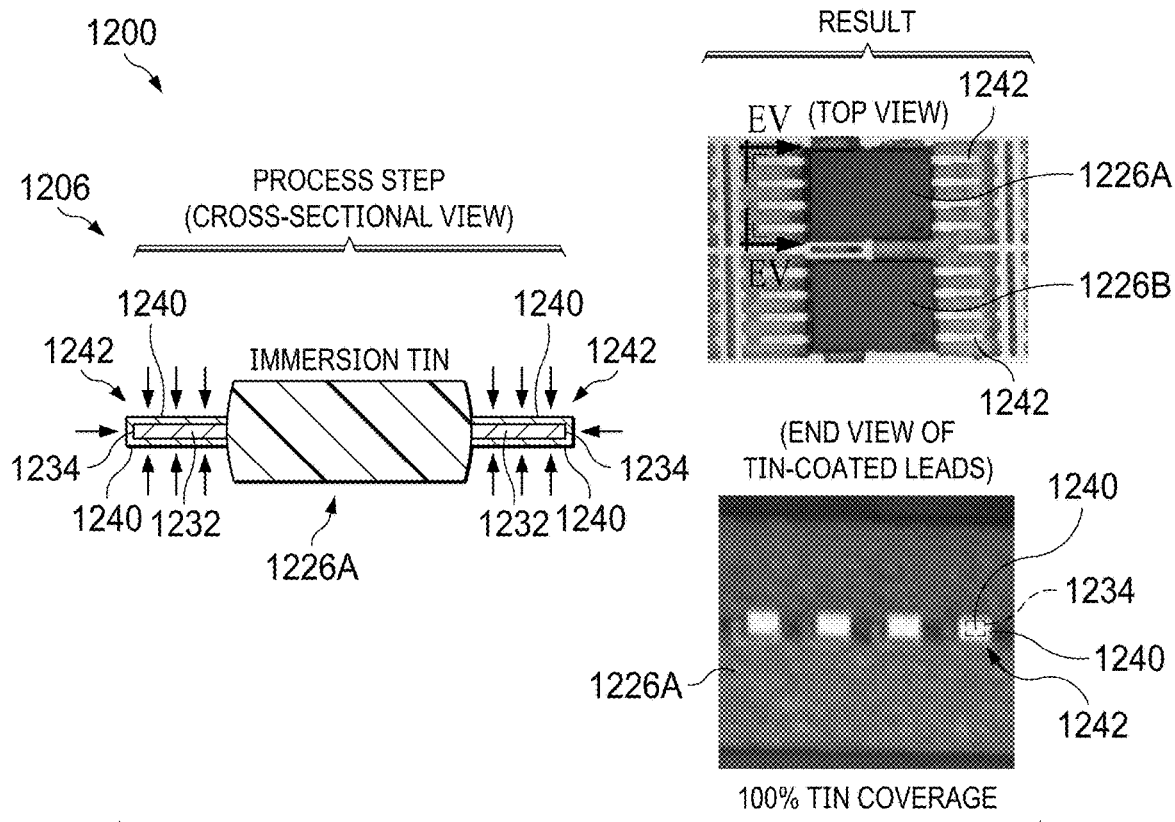

As shown in FIG. 12C, a coating immersion step may be performed at step 1206, in which the leadframe including the array of encapsulated IC structure is immersed in or otherwise fully exposed to a solder-enhancing material to thereby coat the exposed surfaces of the leadframe 1220, including top, bottom, and side surface of each lead 1232 extending from each mold-encapsulated IC structure. In the illustrated example, the solder-enhancing material comprises tin, and thus step 1206 may referred to as a tin immersion. In other embodiments, the solder-enhancing material may comprise any other material that enhances solder wettability or otherwise improves the creation, strength, or other quality of a solder connection between the respective lead 1232 and a PCB or other structure to which the respective IC structure is mounted.

The cross-sectional view (left side) shows the solder-enhancing coating 1240 on the exposed leadframe surfaces of IC structure 1226A. As shown, all exposed surfaces of each lead 1232, including the distal end surface 1234 of each lead 1232, are coated by solder-enhancing coating 1240, unlike in a conventional process in which the distal end surfaces of the leads remain uncoated. The tin-coated leads 1232 are indicated at 1242. In one embodiment solder-enhancing coating 1240 comprises tin.

The corresponding top view (right side) shows the result of the tin immersion process on IC structures 1226A and 1226B, including tin-coated leads 1242 extending from IC structures 1226A and 1226B. In addition, to the cross-sectional view and top view discussed above, FIG. 12C includes an end view along the direction labelled EV in the top view. The end view shows the distal ends of the four tin-coated leads 1242 extending from one side of the mold-encapsulated IC structure 1226A. As shown in the end view, the distal end of each lead 1242, including the distal end surface 1234 of the lead 1242, is coated by solder-enhancing coating 1240. In this embodiment, the entire surface area of the distal end surface 1234 of each lead 1232 is coated with tin by the tin immersion process, which may improve solder wettability and/or solder quality for solder connecting the leads 1232 to a PCB, as discussed below.

Figure 7:
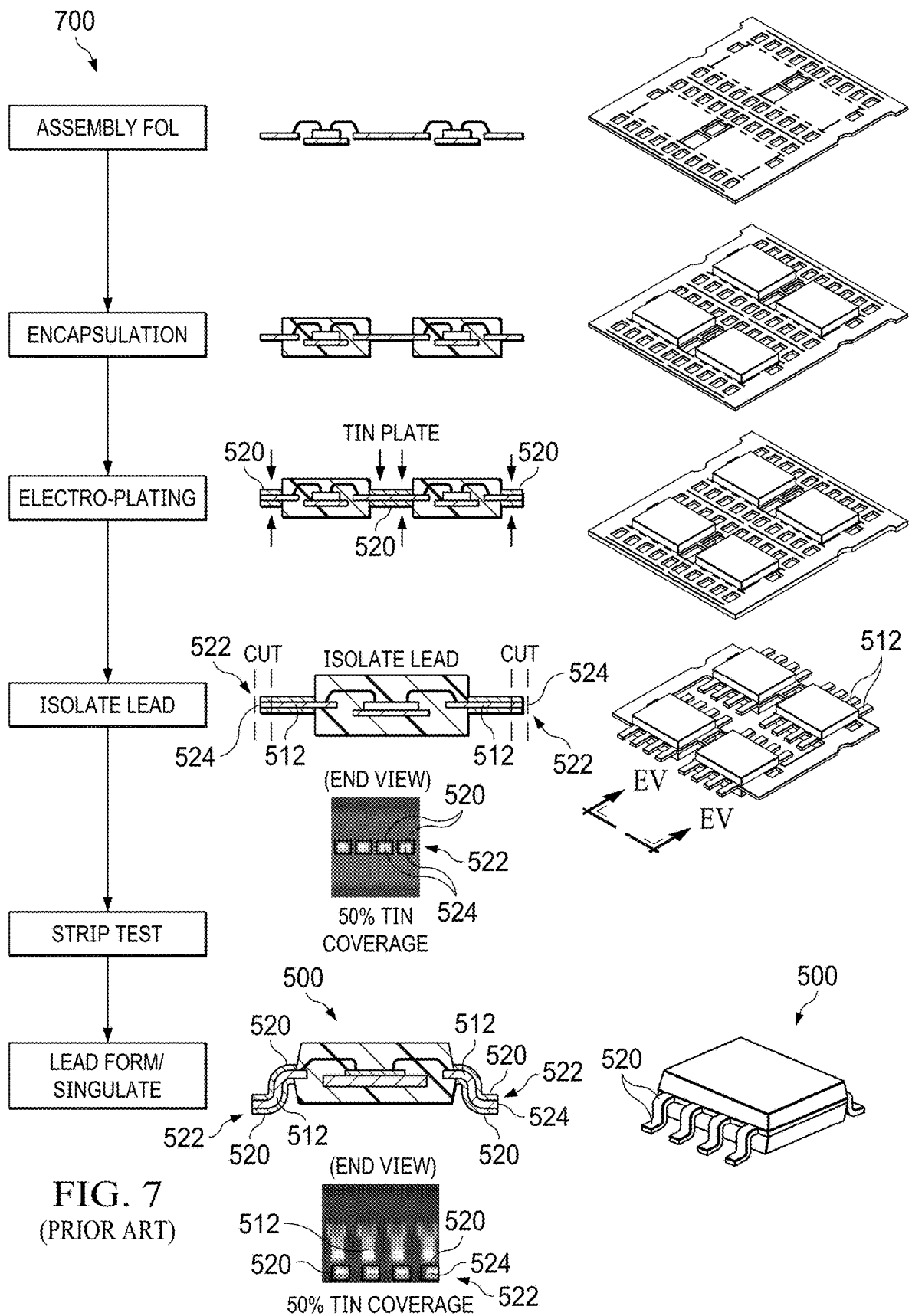
FIG. 7 shows an example process flow, including process steps and corresponding three-dimensional and cross-sectional views for selected process steps, for producing a group of singulated flat leads packages, according to the prior art.

After the tin immersion step, a strip test, as described in relation to FIG. 7, may be performed to electrically test the IC structures while they are isolated from each other but still physically connected to the common leadframe.

Figure 12D:
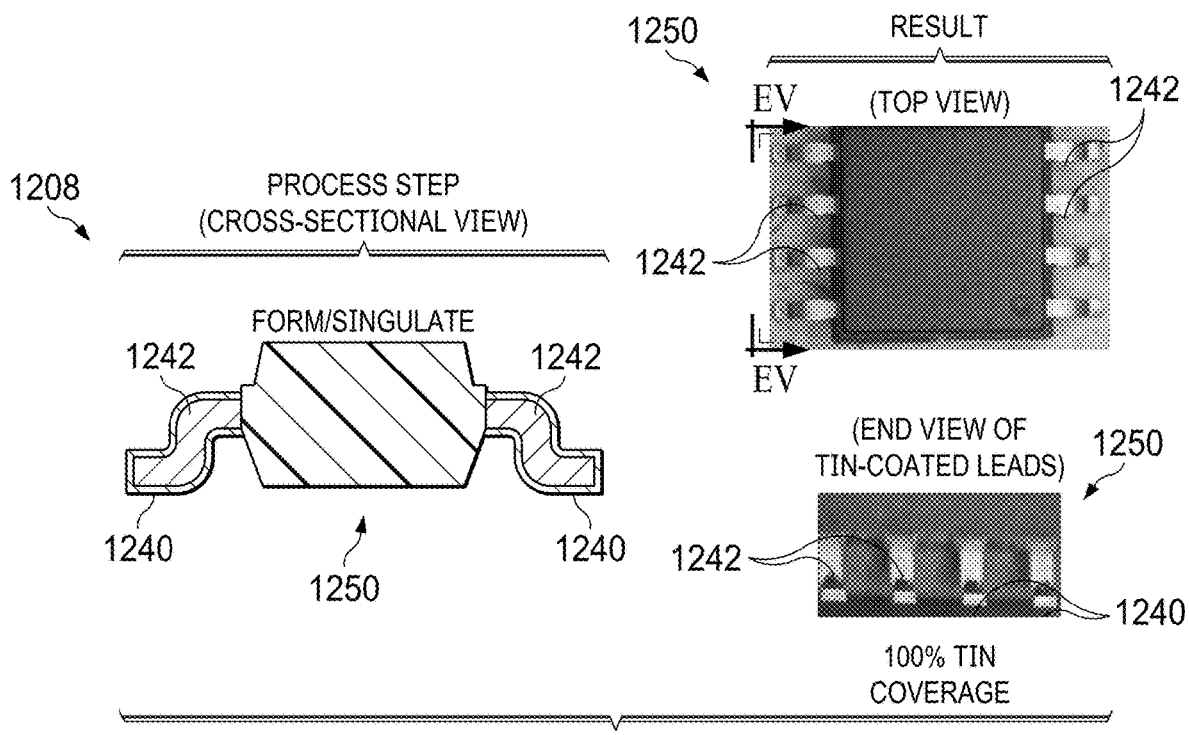

As shown in FIG. 12D, lead forming and singulation processes may be performed at step 1208, in which the (a) the tin-coated leads 1242 extending from each IC structure are formed, for example by physically bending/deforming the tin-coated leads 1242 downwardly toward the bottom surface of the respective IC structure, and (b) the IC structures are singulated from each other by a singulation cutting process, to thereby define a group of formed and singulated IC devices 1250 having tin-coated leads 1242. The singulation cutting process may include cutting the leadframe 1120 at locations that were not cut during the isolation cutting process, e.g., at locations distinct from the leadframe leads 1232 defined by the isolation cutting process. Thus, the singulation cutting process does not remove the tin coating on the lead 1232, such that the distal ends of the leads 1232 (including the distal end surfaces 1234) remain fully tin-coated after singulation of the IC structures.

The IC device 1250 shown in FIG. 12D represents the IC structure 1226A shown in FIG. 12C after the lead forming and singulation process at step 1208. FIG. 12D includes an end view along the direction labelled EV in the top view, which shows the distal ends of the four tin-coated leads 1242 extending from one side of the singulated IC device 1250. As shown in the end view, the distal end of each tin-coated lead 1242 is fully covered by the solder-enhancing coating 1240. As discussed above, using a tin immersion process to provide tin-coating of the entire distal end of each lead 1242 (including the full surface area of the distal end surface 1234) may improve solder wettability and/or solder quality for solder connecting the leads 1242 to a PCB or other structure to which the IC device 1250 may be mounted.

Figure 13:
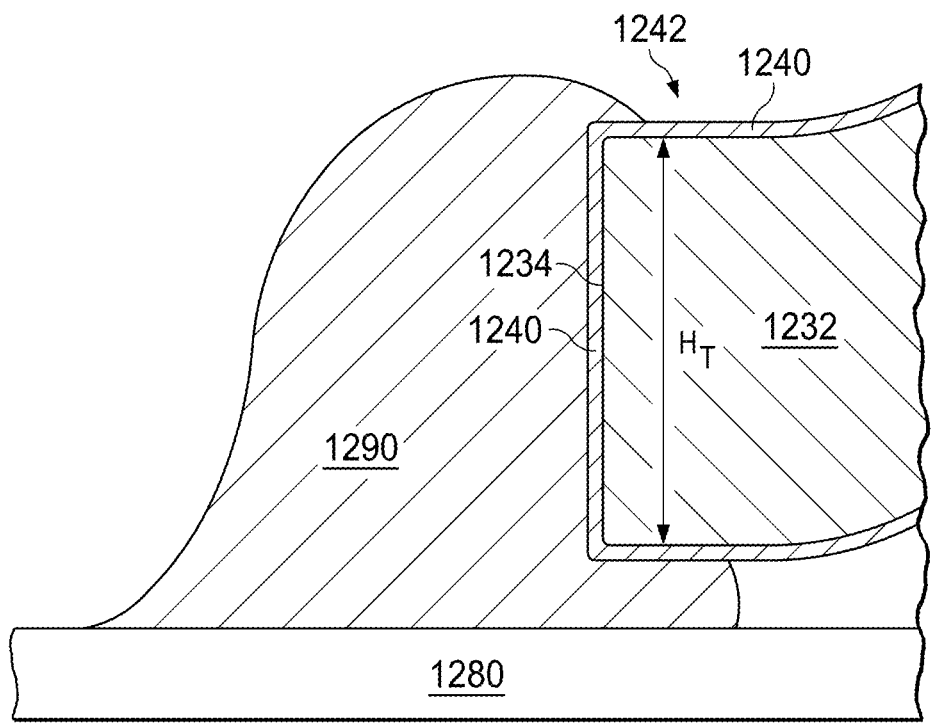
FIG. 13 is a cross-sectional view of the end of a leadframe terminal of a flat leads package according to the example method shown in FIGS. 12A-12*d*, and solder connected to an underlying PCB pad, according to one example embodiment of the invention.

FIG. 13 is a cross-sectional view of a portion of an electronic device including a flat leads package solder-mounted to a PCB, according to one embodiment. In particular, FIG. 13 shows the tin-coated distal end of one leadframe lead 1232 of the flat leads package, produced according to the example method 1200 shown in FIGS. 12A-12D, solder connected to an underlying PCB pad 1280, according to one example embodiment of the invention. As shown, all surfaces of the leadframe lead 1232, including the full surface area of the distal end surface 1234, have been coated with solder-enhancing tin coating 1240 by a tin immersion process (see step 1206, discussed above) to enhance the solder connection. As discussed above, tin-coating the entire distal end of the lead 1232 may enhance the flow of the solder material to form a solder fillet 1290 that extends at least 80%, at least 90%, or 100% up the full height HT of the distal end surface 1234 of the lead 1232, to thereby provide improved solder wettability and/or improved solder connection. In the example shown in FIG. 13, the resulting solder fillet extends 100% up the height HT of the distal end surface 1234 of the lead 1232.

The invention claimed is:

1. A method for forming an integrated circuit (IC) package, the method comprising:
    forming an IC package structure including a plurality of encapsulated IC structures formed on a common leadframe, the leadframe having exposed upper leadframe surfaces;
    coating the exposed upper leadframe surfaces with a first solder-enhancing coating material;
    performing an isolation cutting process to electrically isolate the plurality of encapsulated IC structures from each other by selectively cutting through the leadframe at locations between adjacent encapsulated IC structures, wherein the isolation cutting process forms an isolation cut groove defining a plurality of leadframe terminal pairs, each leadframe terminal pair including a pair of leadframe terminals on opposing sides of the isolation cut groove, each leadframe terminal having an exposed terminal sidewall surface at a distal end of the leadframe terminal and facing into the isolation cut groove;
    after performing the isolation cutting process, performing an immersion coating process including immersing the IC package structure in a second solder-enhancing coating material to (a) coat a full surface area of the exposed terminal sidewall surface at the distal end of each leadframe terminal to define a fully coated distal terminal sidewall surface of each leadframe terminal and (b) further coat the upper leadframe surfaces previously coated with the first solder-enhancing coating material to thereby increase a thickness of solder-enhancing material on the upper leadframe surfaces;

after performing the immersion coating process, performing a singulation cutting process to singulate the plurality of encapsulated IC structures.

2. The method of claim 1, wherein the second solder-enhancing coating material comprise tin.

3. The method of claim 1, further comprising, after performing the immersion coating process, deforming the leadframe terminals leads toward a bottom surface of the respective encapsulated IC structure.

4. The method of claim 1, wherein the singulation cutting process comprises cutting the leadframe at locations other than at the leadframe terminals defined by the isolation cutting process.

5. The method of claim 1, wherein the singulation cutting process does not remove the second solder-enhancing coating material on the exposed end sidewall surface at the distal end of each leadframe terminal.

6. The method of claim 1, further comprising, after the singulation cutting process to singulate the plurality of encapsulated IC structures, performing a soldering process on the fully coated distal end sidewall surface of a selected leadframe terminal to form a solder having a solder connection area covering at least 80% of a full height of the fully coated distal end sidewall surface.

7. The method of claim 1, further comprising, after the singulation cutting process to singulate the plurality of encapsulated IC structures, performing a soldering process on the fully coated distal end sidewall surface of a selected leadframe terminal to form a solder having a solder connection area covering at least 90% of a full height of the fully coated distal end sidewall surface.

8. The method of claim 1, further comprising, after the singulation cutting process to singulate the plurality of encapsulated IC structures, performing a soldering process on the fully coated distal end sidewall surface of a selected leadframe terminal to form a solder having a solder connection area covering 100% of a full height of the fully coated distal end sidewall surface.

9. The method of claim 1, wherein the plurality of encapsulated IC structures comprises flat leads structures.

10. The method of claim 1, wherein the plurality of encapsulated IC structures comprises quad flat packages (QFPs).

11. The method of claim 1, wherein the plurality of encapsulated IC structures comprises small outline transistor (SOT) packages.

12. The method of claim 1, wherein the immersion process coats the full surface area of the exposed terminal sidewall surface of each leadframe terminal, but does not fill the isolation cut groove, such that a coating-free gap remains in the isolation cut groove.

13. The method of claim 12, wherein:
the coating-free gap in the isolation cut groove has a coating-free gap width; and
the singulation cutting process has a cutting width less than the coating-free gap width, such that the singulation cutting process does not remove the second solder-enhancing coating material on the exposed end sidewall surface of each leadframe terminal.

14. The method of claim 1, wherein the first solder-enhancing coating material comprise tin.

15. The method of claim 1, wherein coating the exposed upper leadframe surfaces with a first solder-enhancing coating material comprises a tin electroplating process.

16. A method for forming an integrated circuit (IC) package, the method comprising:
forming an IC package structure including a plurality of encapsulated IC structures formed on a common leadframe;
performing an isolation cutting process to electrically isolate the plurality of encapsulated IC structures from each other by selectively cutting through the leadframe at locations between adjacent encapsulated IC structures, wherein the isolation cutting process forms an isolation cut groove defining a plurality of leadframe terminal pairs, each leadframe terminal pair including a pair of leadframe terminals on opposing sides of the isolation cut groove, each leadframe terminal having an exposed terminal sidewall surface at a distal end of the leadframe terminal and facing into the isolation cut groove;
after performing the isolation cutting process, performing an immersion coating process including immersing the IC package structure in a solder-enhancing coating material, wherein the immersion coating process (a) coats a full surface area of the exposed terminal sidewall surface at the distal end of each leadframe terminal with the solder-enhancing coating material to define a fully coated distal terminal sidewall surface of each leadframe but (b) does not fill the isolation cut groove, such that a coating-free gap having a coating-free gap width remains in the isolation cut groove; and
after performing the immersion coating process, performing a singulation cutting process to singulate the plurality of encapsulated IC structures, wherein the singulation cutting process has a cutting width less than the coating-free gap width, such that the singulation cutting process does not remove the solder-enhancing coating material on the exposed end sidewall surface of each leadframe terminal.

\* \* \* \* \*